United States Patent
Sim et al.

(10) Patent No.: US 7,531,409 B2
(45) Date of Patent: May 12, 2009

(54) FABRICATION METHOD AND STRUCTURE FOR PROVIDING A RECESSED CHANNEL IN A NONVOLATILE MEMORY DEVICE

(75) Inventors: Sang-Pil Sim, Seongnam-si (KR); Kwang-soo Kim, Wansan-gu (KR); Chan-Kwang Park, Seoul (KR); Heon-Kyu Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 126 days.

(21) Appl. No.: 11/583,796

(22) Filed: Oct. 20, 2006

(65) Prior Publication Data

US 2007/0122968 A1 May 31, 2007

(30) Foreign Application Priority Data

Nov. 1, 2005 (KR) ...................... 10-2005-0103866
Jun. 19, 2006 (KR) ...................... 10-2006-0055061

(51) Int. Cl.
*H01L 21/336* (2006.01)
(52) U.S. Cl. ...................................... 438/259; 438/427
(58) Field of Classification Search ................. 438/259, 438/427
See application file for complete search history.

(56) References Cited

U.S. PATENT DOCUMENTS

| | | | |
|---|---|---|---|
| 6,239,465 B1 | 5/2001 | Nakagawa | |
| 2007/0122968 A1* | 5/2007 | Sim et al. | 438/243 |
| 2008/0213971 A1* | 9/2008 | Mitsuhira et al. | 438/427 |

FOREIGN PATENT DOCUMENTS

| | | |
|---|---|---|
| JP | 2000-223676 | 8/2000 |
| JP | 1020000052310 A | 8/2000 |
| JP | 2000-260887 | 9/2000 |
| KR | 1020010035995 A | 5/2001 |
| KR | 1020020091984 A | 12/2002 |
| KR | 1020040104290 A | 12/2004 |
| KR | 1020050002473 A | 1/2005 |
| KR | 1020050038752 A | 4/2005 |
| KR | 1020050093177 A | 9/2005 |
| KR | 1020050106280 A | 9/2005 |
| KR | 1020070004351 A | 9/2007 |

* cited by examiner

*Primary Examiner*—Jack Chen
(74) *Attorney, Agent, or Firm*—Volentine & Whitt, PLLC

(57) ABSTRACT

A method of fabricating a nonvolatile memory device includes preparing a semiconductor substrate including a cell array region. The method also includes forming a recessed region in the cell array region by etching the semiconductor substrate. The method includes etching at least a portion of the semiconductor substrate that partially includes the recessed region and forming first and second trenches that differ in depth, intersect the recessed region, and link with each other. The method includes forming a device isolation layer having rugged bottoms and defining an active region by filling an insulating material in the first and second trenches. The method includes forming a gate insulation layer on the semiconductor substrate of the active region including the recessed region and forming a gate structure on the gate insulation layer, to fill the recessed region, the gate structure including a floating gate, an intergate insulating pattern, and a control gate.

11 Claims, 20 Drawing Sheets

FABRICATION METHOD AND STRUCTURE FOR PROVIDING A RECESSED CHANNEL IN A NONVOLATILE MEMORY DEVICE

BACKGROUND OF THE INVENTION

1. Field of the Invention

The present disclosure relates to manufacturing methods for semiconductor memory devices and, more particularly, to fabrication methods and structures for providing recessed channels in nonvolatile memory devices.

This U.S. non-provisional patent application claims priority under 35 U.S.C. § 119 to Korean Patent Application No. 2005-103866 filed on Nov. 1, 2005, and Korean Patent Application No. 2006-55061 filed on Jun. 19, 2006, the entire contents of which are hereby incorporated by reference.

2. Description of Related Art

With higher integration of semiconductor devices, various physical limitations may affect the performance of the semiconductor devices. For example, because of high integration densities, a channel length of the device may become shorter. The shorter channel length of the device may lead to problems such as, for example, a punch-through effect. In order to overcome such limitations associated with the channel length of the semiconductor device, various structures and fabrication methods for extending a channel length in a highly integrated semiconductor device have been studied.

One such example of a highly integrated semiconductor device includes a recessed channel array transistor (RCAT). The structure of the RCAT includes sidewalls and a recessed region. Specifically, the bottom of the recessed region is used for a channel region.

A conventional method for fabricating a nonvolatile memory device having the recessed channels is as follows. A device isolation layer is formed in a semiconductor substrate. This device isolation layer may be used to define an active region. Furthermore, the defined active region may include the channel for the semiconductor device. Specifically, the recessed region for the channel is formed in the active region. In addition, the recessed region may have a width smaller than that of the active region. Thus, it may be beneficial to form a photoresist pattern having an opening that is smaller than the dimensions of the active region. In particular, the opening of the photoresist pattern defines the recessed region.

While the disclosed RCAT provides for higher integration densities in semiconductor devices, it suffers from several shortcomings. For example, with higher integration of semiconductor devices, it may become more difficult to precisely arrange the photoresist pattern having a smaller opening.

In addition, the higher integration of nonvolatile semiconductor devices also leads to narrower widths of floating gates. The narrow widths of floating gates may also cause many problems. For example, the narrow floating gates may have insufficient processing margins because of the gates' reduced width. This reduction in processing margins may make it difficult to compensate for the misalignment that occurs when patterning the floating gates. In order to solve this problem, the floating gates may be arranged in self-alignment with the device isolation layer. In this case, the device isolation layer is designed to have a height corresponding to a height of the floating gates. However, it may be practically very difficult to implement such a precise photoresist pattern for the recessed regions in the structure of the device isolation layer having a high surface. This is because the depth of focus (DOF) margin becomes smaller because of such a physical limitation.

The present disclosure is directed towards overcoming one or more problems associated with the prior art semiconductor devices.

SUMMARY OF THE INVENTION

One aspect of the present disclosure includes a method of fabricating a nonvolatile memory device. The method includes preparing a semiconductor substrate including a cell array region. The method also includes forming a recessed region in the cell array region by etching the semiconductor substrate. In addition, the method includes etching at least a portion of the semiconductor substrate that partially includes the recessed region and forming first and second trenches that differ in depth, intersect the recessed region, and link with each other. The method also includes forming a device isolation layer having rugged bottoms and defining an active region by filling an insulating material in the first and second trenches. The method also includes forming a gate insulation layer on the semiconductor substrate of the active region including the recessed region. The method also includes forming a gate structure on the gate insulation layer, to fill the recessed region, the gate structure including a floating gate, an intergate insulating pattern, and a control gate.

Another aspect of the present disclosure includes a method of fabricating a nonvolatile memory device. The method includes preparing a semiconductor substrate including a cell array region. The method also includes forming a pad oxide layer and a first hard mask layer on the semiconductor substrate. The method also includes forming first hard mask patterns and pad oxide patterns by patterning the first hard mask layer and the pad oxide layer in the cell array region, the first hard mask patterns being formed in parallel with each other and crossing over the semiconductor substrate, and the pad oxide patterns being formed under the first hard mask patterns. In addition, the method includes forming pluralities of recessed regions in the semiconductor substrate by patterning the semiconductor substrate by using the first hard mask patterns as an etch mask. The method also includes exposing the pad oxide patterns by removing the first hard mask patterns. The method also includes forming pluralities of second hard mask patterns such that the pluralities of second hard mask patterns are parallel with each other and intersect the recessed regions on the semiconductor substrate where the pad oxide patterns are exposed. The method also includes etching the pad oxide patterns and the semiconductor substrate to form a first trench, and etching the semiconductor substrate at the bottoms of the recessed regions to form a second trench deeper than the first trench, by using the second hard mask patterns as an etch mask. The method also includes forming a device isolation layer having rugged bottoms and defining an action region by filling an insulating material in the first and second trenches. The method also includes exposing the semiconductor substrate including the recessed regions adjacent to the device isolation layer by removing the second hard mask patterns and the pad oxide patterns. In addition the method includes forming a gate insulation layer on the exposed semiconductor substrate. The method also includes forming gate structures on the gate insulation layer to fill the recessed regions, each of the gate structures including a floating gate, an interlevel gate insulation pattern, and a control gate.

Another aspect of the present disclosure includes a nonvolatile memory device. The nonvolatile memory device includes a semiconductor substrate including a cell array region. The memory device also includes a device isolation layer having a rugged bottom profile with shallower and deeper bottoms, intersecting the semiconductor substrate in the cell array region and defining an active region, wherein the active region comprises a recessed region. The memory device also includes a gate insulation layer on the active region. The memory device also includes a gate structure including a control gate, an intergate insulating layer, and a floating gate on the gate insulation layer, wherein the gate insulation layer is conformably provided along a profile of the recessed region and the floating gate is provided to fill the recessed region.

Yet another aspect of the present disclosure includes a nonvolatile memory device. The memory device includes device isolation layers provided in parallel with each other in a semiconductor substrate, defining active regions. The memory device also includes pluralities of parallel word lines intersecting the device isolation layers on the semiconductor substrate. The memory device also includes a floating gate interposed between the word lines and the active regions, an intergate insulating pattern interposed between the word lines and the floating gate, a gate insulation layer interposed between the floating gate and the active regions, drain regions provided in the active regions at a first side of the word lines, the drain regions being isolated from each other through the device isolation layers, a common source line provided by connecting the active regions with each other at the second side of the word lines, being parallel with the word lines, a bit line conductively connected to the drain regions, crossing over the word lines, wherein the active region under the floating gate comprises a recessed region, wherein the gate insulation layer is conformably provided along a profile of the recessed region and the floating gate is provided to fill the recessed region, and wherein the device isolation layer has a rugged bottom profile, with shallower and deeper bottoms, along the bit line.

Yet another aspect of the present disclosure includes a nonvolatile memory device. The device includes a semiconductor substrate. The device also includes a device isolation layers formed in parallel with each other in the semiconductor substrate, defining an active region, string and ground selection lines in parallel with each other, crossing over the active region, pluralities of parallel word lines interposed between the string and ground selection lines, crossing over the active region, a first floating gate interposed between the word lines and the active region, a first intergate insulating pattern interposed between the word lines and the first floating gate, a first gate insulation layer interposed between the first floating gate and the active region, a second gate insulation layer interposed between the first floating gate and the active region, a bit line conductively connected to the active region adjacent to the selection lines, intersecting the selection lines, wherein the active region under the selection lines comprises a recessed region, wherein the second gate insulation layer is conformably provided along a profile of the recessed region, and wherein the device isolation layers have a rugged bottom profile with shallower and deeper bottoms along the bit line.

BRIEF DESCRIPTION OF THE FIGURES

The accompanying figures are included to provide a further understanding of the disclosure, and are incorporated in and constitute a part of this specification. The drawings illustrate exemplary embodiments of the disclosure and, together with the description, serve to explain principles of the present disclosure. In the figures.

DETAILED DESCRIPTION OF PREFERRED EMBODIMENTS

Figure 1:
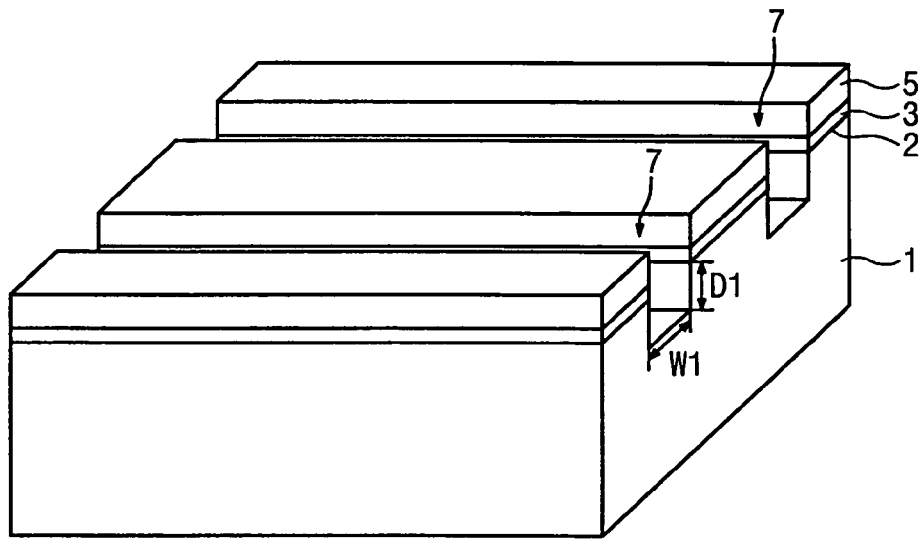
FIGS. 1 through 11 are perspective views illustrating sequential processing steps of fabricating a NOR-type non-volatile memory device in accordance with an exemplary disclosed embodiment of the invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Furthermore, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

FIGS. 1 through 11 are perspective views illustrating sequential processing steps of fabricating a NOR-type nonvolatile memory device in accordance with an exemplary disclosed embodiment.

Referring to FIG. 1, a pad oxide layer (not shown) is deposited entirely on a semiconductor substrate 1. Furthermore, a first hard mask layer (not shown) is deposited on the pad oxide layer. The first hard mask layer may comprise of silicon nitride, silicon oxynitride, or/and photoresist. The semiconductor substrate 1 may comprise crystalline silicon, including a cell array region and a peripheral circuit region. In an exemplary embodiment, the semiconductor substrate 1 corresponds to a cell array region.

A first photoresist pattern (not shown) including openings to confine recessed channel regions is formed on the first hard mask layer. Furthermore, using the first photoresist pattern as an etch mask, the first hard mask layer is selectively etched to form a first hard mask pattern 5. That is, the first hard mask pattern 5 may be a photoresist pattern formed by means of a photolithography process. In an exemplary embodiment, a chemical attachment process is available to further shrink a width of the opening (i.e., a first width W1) defined by the first hard mask pattern 5. In detail, when a photoresist material is coated and thermally treated after forming the first hard mask pattern 5, the photoresist material is attached to the surface of the first hard mask pattern 5 and simultaneously shrunk down to form openings at spaces provided by the first hard mask pattern 5 in widths smaller than the first width W1. In addition, the hard mask pattern 5 itself may be completed by means of photolithography, etching, and/or a chemical attachment.

The semiconductor device of FIG. 1 also includes a pad oxide pattern 3. Specifically, using the first hard mask pattern 5 as an etch mask, the pad oxide layer is selectively etched to form the pad oxide pattern 3. In addition, the semiconductor substrate 1 there under is etched to form recessed regions 7. These recessed regions 7 have bottoms leveled lower than a surface 2 of the semiconductor substrate 1 that has a first width W1 and a first depth D1. The recessed regions 7 are provided for recessed channels completed through the subsequent processing step.

In an exemplary embodiment, the recessed regions 7 may be arranged in parallel with each other in plurality. Furthermore, before forming trenches, the first photoresist pattern is formed on the first hard mask layer that is flattened on the flat semiconductor substrate 1. Because the first photoresist pattern is formed before forming the trenches, a sufficient margin for DOF may be included in the semiconductor device. Thereby, it is possible to precisely form the recessed regions 7 in required depth and width therefor.

Figure 2:
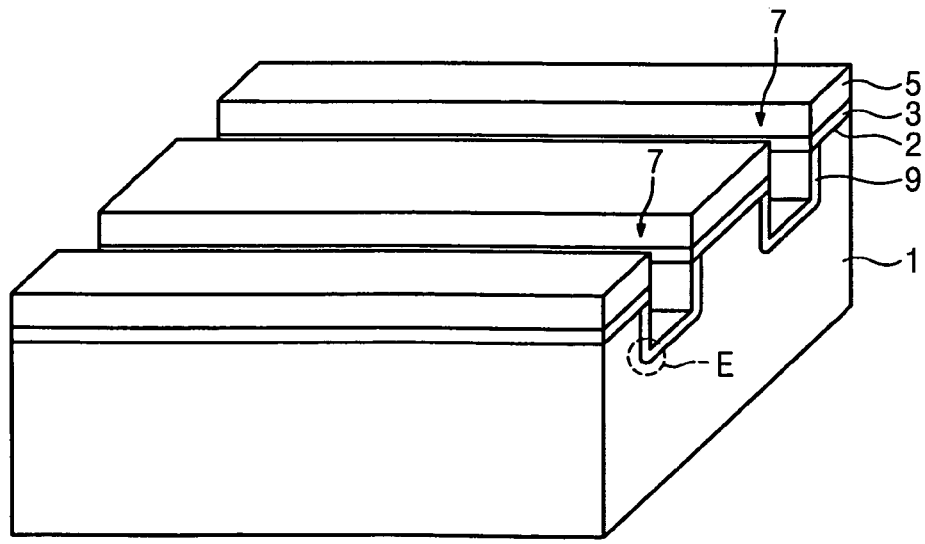

Referring to FIG. 2, the semiconductor substrate 1 including the recessed regions 7 is oxidized to form a passivation oxide layer 9. This passivation oxide layer 9 is formed on the bottoms and sidewalls of the recessed regions 7. In particular, during the oxidation, the passivation oxide layer 9 is rounded, as shown by the enclosed circle E, at corners where the bottoms of the recessed regions 7 meet with the sidewalls thereof.

Figure 3:
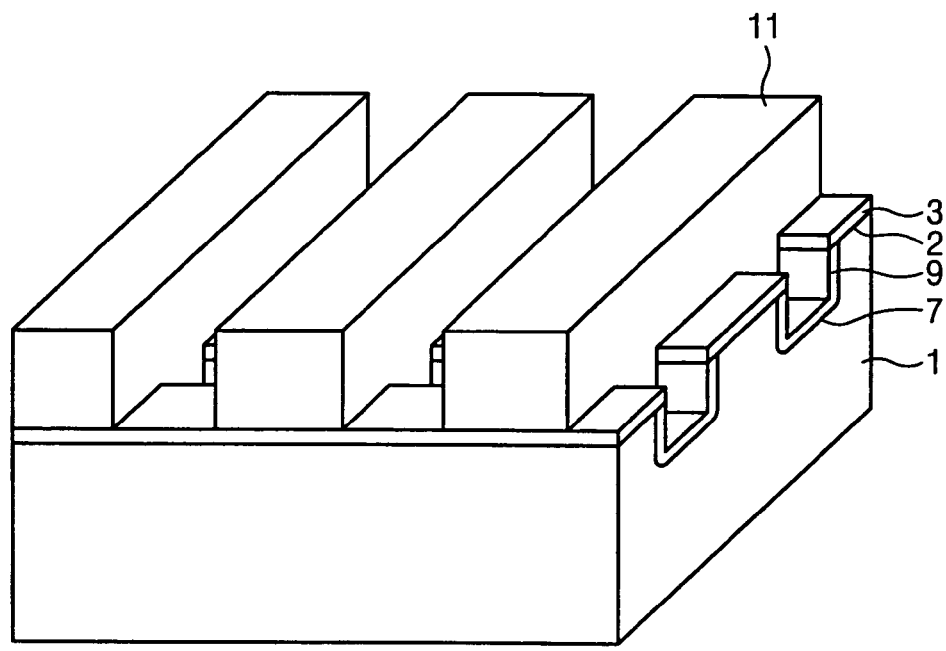

Referring to FIG. 3, the first hard mask pattern 5, is removed from the top of the semiconductor substrate 1. The removal of the first hard mask pattern 5 may be performed by using various chemicals such as, for example, phosphoric acid. Furthermore, during the removal of the first hard mask pattern 5, the passivation oxide layer 9 and the pad oxide patterns 3 may protect the semiconductor substrate 1 from being etched away.

After removing the first hard mask pattern 5, a second hard mask layer is deposited all over the semiconductor substrate 1. Beneficially, the second hard mask layer is formed in a thickness of more than a half (½) the width WI of the recessed region 7. In addition, the second hard mask layer fills the recessed regions 7 and also has a flat surface. Furthermore, a second photoresist pattern (not shown) is formed on the second hard mask layer. Because the second photoresist pattern is settled on the second hard mask layer having the flat surface, there is a sufficient margin for DOF. This sufficient margin for DOF may allow for the precise formation the second photoresist pattern.

Using the second photoresist pattern as an etch mask, the second hard mask layer is patterned to form second hard mask patterns 11. Specifically, the second hard mask patterns 11 are formed parallel to each other and in plurality. Furthermore, the second hard mask patterns intersect the recessed regions 7 and define positions where a device isolation layer will be settled by a subsequent processing step. Furthermore, the second hard mask patterns 11 partially fill the recessed regions 7. The second hard mask patterns 11 may comprise of various chemicals such as, for example, silicon nitride or silicon oxynitride. Because the second photoresist pattern is correctly formed, the second hard mask patterns 11 can be formed accurately by using the second photoresist pattern as the etch mask.

Figure 4:
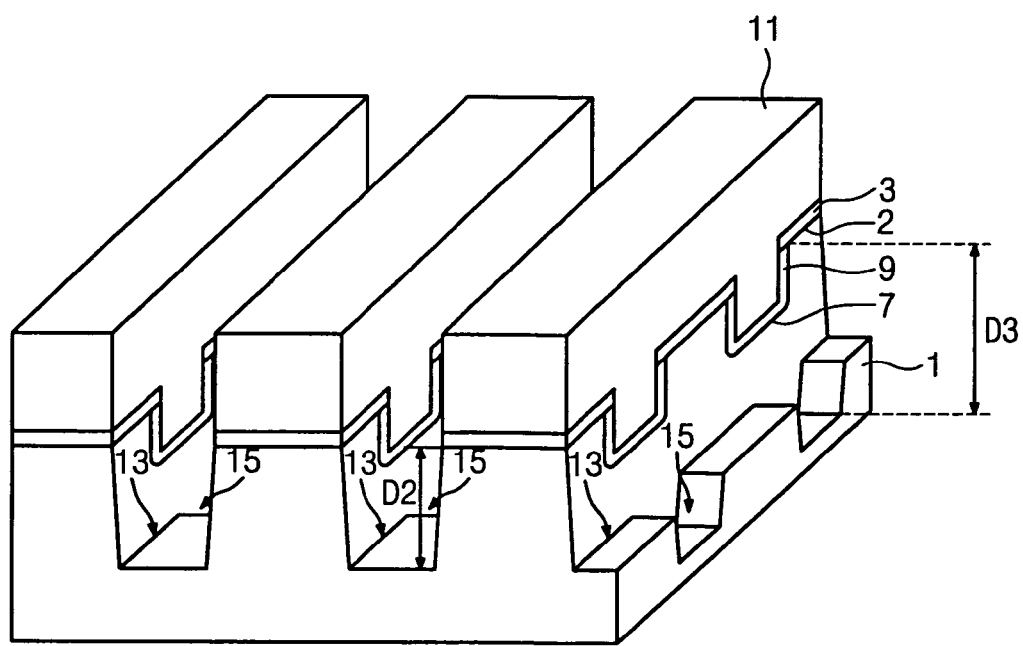

Referring to FIG. 4, using the second hard mask patterns 11 as an etch mask, the pad oxide patterns 3, the passivation oxide layer 9, and the semiconductor substrate 1 are etched to form first trenches 13 and second trenches 15. Specifically, the first trenches 13 have a second depth D2. Furthermore, the second trenches 15, which link with the first trenches, have a third depth D3. In particular, the first trenches 13 are formed by grooving the semiconductor substrate 1 under the pad oxide patterns 3, while the second trenches 15 are formed by grooving the semiconductor substrate 1 under the recessed regions 7. Therefore, the third depth D3 corresponds to the sum of the first depth D1 in the recessed regions 7 and the second depth D2 in the first trenches 13.

Figure 5:
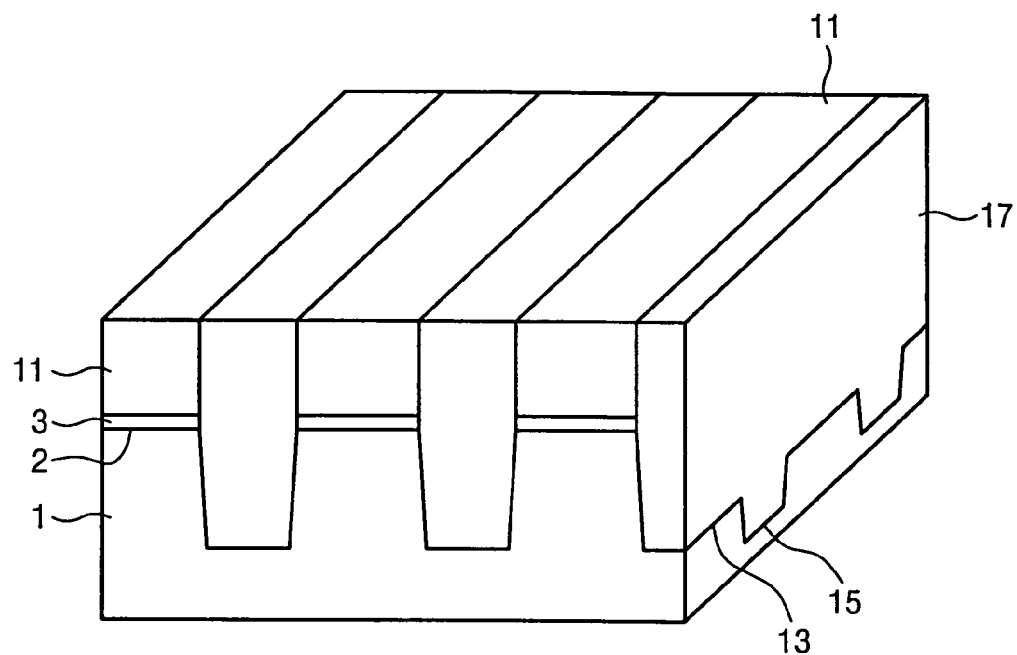

Next, referring to FIG. 5, an insulating material for a device isolation layer is formed all over the semiconductor substrate 1. Specifically, this insulating material is formed in a thickness larger than ½ of the width of the first trenches 13. Furthermore, the insulating material fills the first and second trenches 13 and 15. The insulating material may be formed in a single layer or a multi-level layer, containing materials such as, for example, thermal oxide, silicon nitride, silicon oxynitride, high-density plasma (HDP) oxide, or boron phosphorous silicate glass (BPSG). In addition, the insulating material is flattened (or planarized) to be leveled with the second hard mask patterns 11 to form the device isolation layer 17. The planarization may be carried out by processes such as, for example, chemical-mechanical polishing (CMP) or etch-back process. Profiles on the bottoms of the device isolation layer 17 are rugged by the first and second trenches 13 and 15. The device isolation layer 17 confines active regions in the cell array region. Furthermore, the formation of the device isolation layer 17 exposes the second hard mask patterns 11

Figure 6:
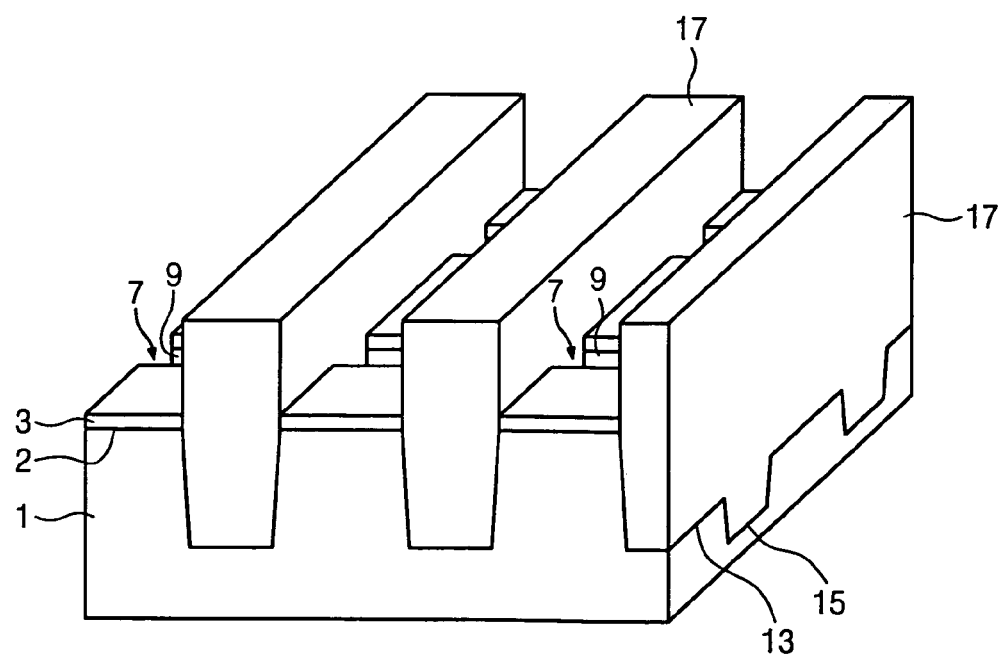

Referring to FIG. 6, the second hard mask patterns 11 are removed from the semiconductor substrate 1. The removal of the second hard mask patterns 11 may be performed by using a chemical such as, for example, phosphoric acid. Upon removal of the second hard mask patterns 11, the passivation oxide layer 9 is exposed on the upper sidewalls of the device isolation layer 17, in the pad oxide layers 3, and the recessed regions 7.

Figure 7:
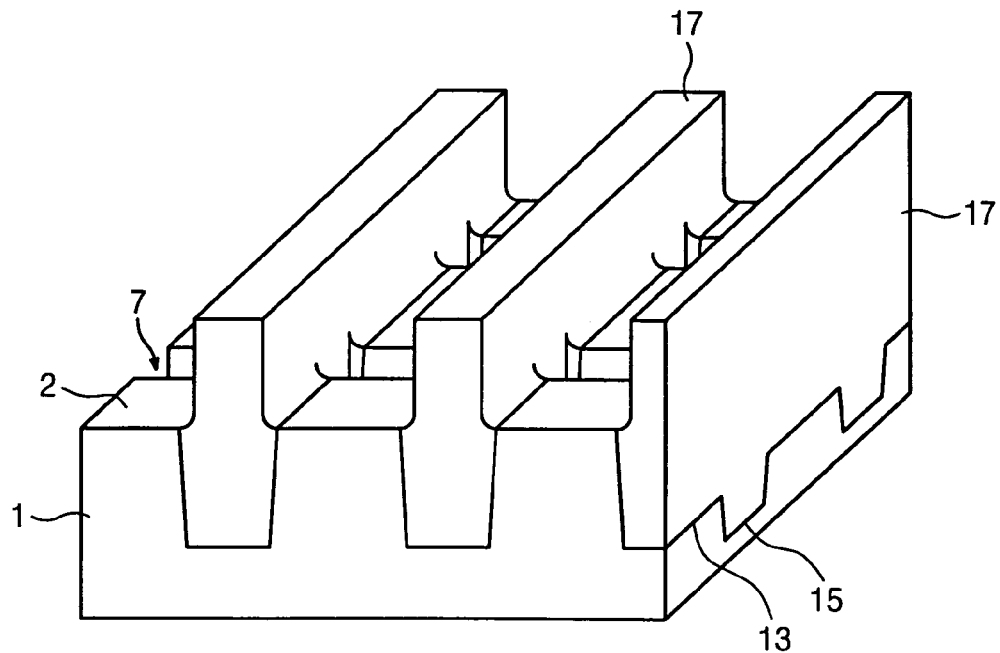

Referring to FIG. 7, the pad oxide patterns 3 and the passivation oxide layers 9 are removed. The removal of the pad oxide patterns 3 and the passivation oxide layer 9 may be performed by chemicals such as, for example, fluoric acid. Furthermore, if the device isolation layer 17 is made of a kind of oxide, the oxides in the device isolation layer 17 are partially removed simultaneously while removing the pad oxide patterns 3 and passivation oxide layers 9. Removal of the pad oxide patterns 3 and the passivation oxide layers 9 causes the surface 2 of the semiconductor substrate 1 to be exposed. In addition, by removing the passivation oxide layer 9, the semiconductor substrate 1 is also partially exposed in the recessed regions 7. Although not shown in FIG. 7, the passivation oxide layer 9 makes the exposed lower corners of the recessed regions 7 rounded as shown by the circle E in FIG. 2.

Figure 8:
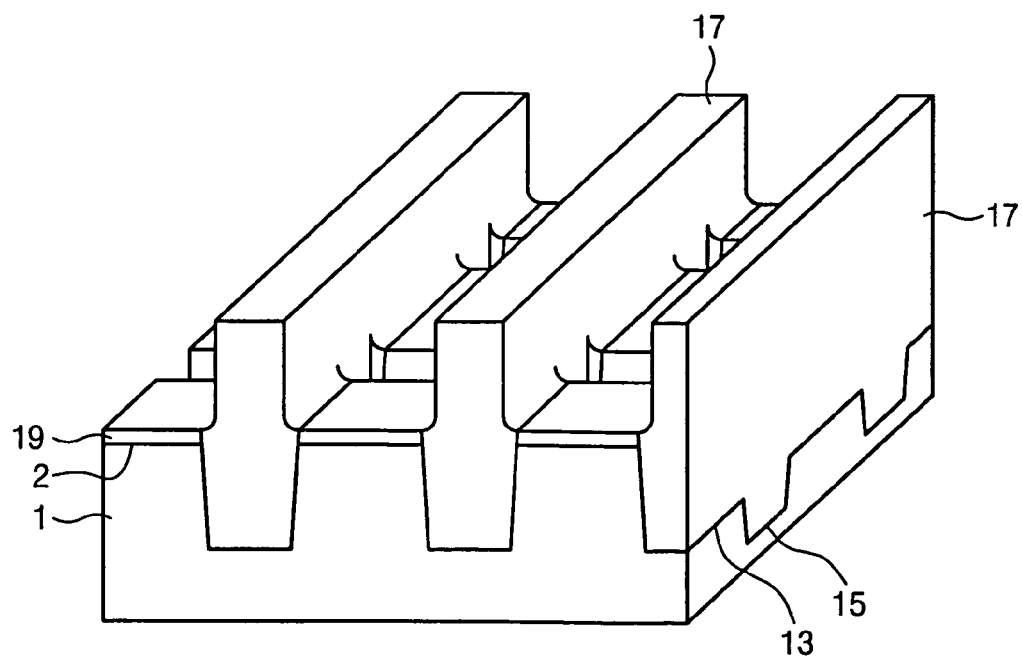

Referring to FIG. 8, an oxidation process is used to form a gate insulating layer 19 on the exposed surface of the semiconductor substrate 1. In particular, the gate insulating layer 19 is conformably formed along the profiles of the recessed regions 7. Because the corners of the recessed regions 7 are rounded, the gate insulating layer 19 is also rounded at the corners of the recessed regions 7. As a result, it prevents concentration of an electric field thereon during an operation of the nonvolatile memory device.

Figure 9:
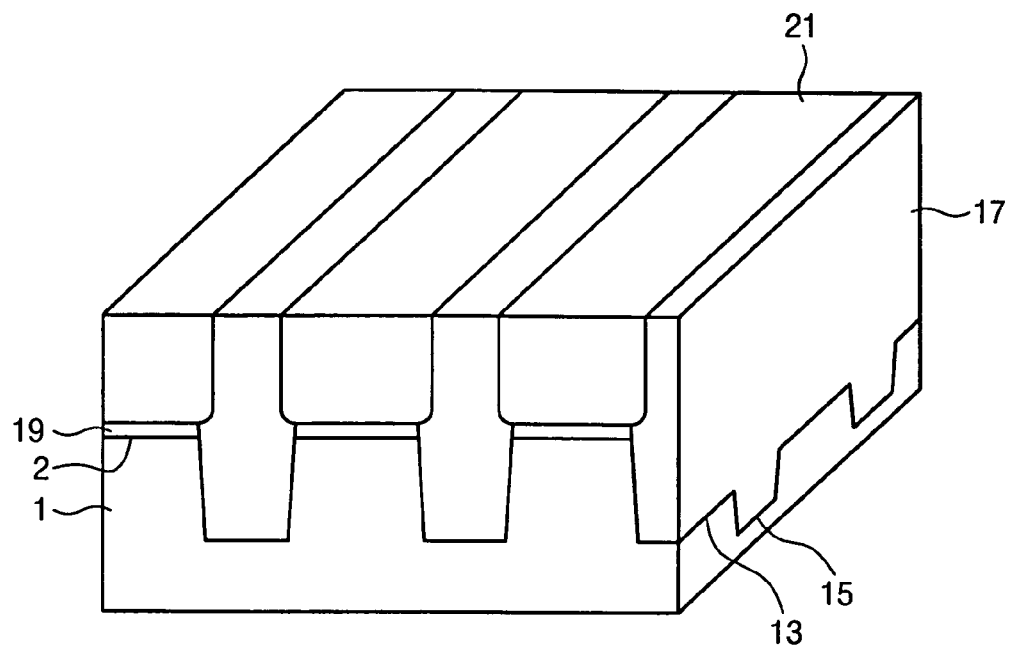

Referring to FIG. 9, a floating gate layer (not shown) is deposited over the semiconductor substrate 1, filling the spaces between the device isolation layers 17. In addition, a planarization process on the floating gate layer is performed to form floating gate patterns 21. Furthermore, the planarization process exposes the upper surface of the device isolation layer 17. Because the floating gate patterns 21 are self-aligned with the device isolation layer 17, there may be no misalignment of the floating gates. The lack of misalignment of the floating gates may provide the semiconductor device with sufficient processing margin. In an exemplary embodiment, the floating gate layer may comprise of doped polysilicon. In addition, the planarization process may be carried out through a CMP, an etch-back process, or any other such process. Furthermore, in the planarization process, the device isolation layer 17 functions as a planarization stopping layer.

Figure 10:
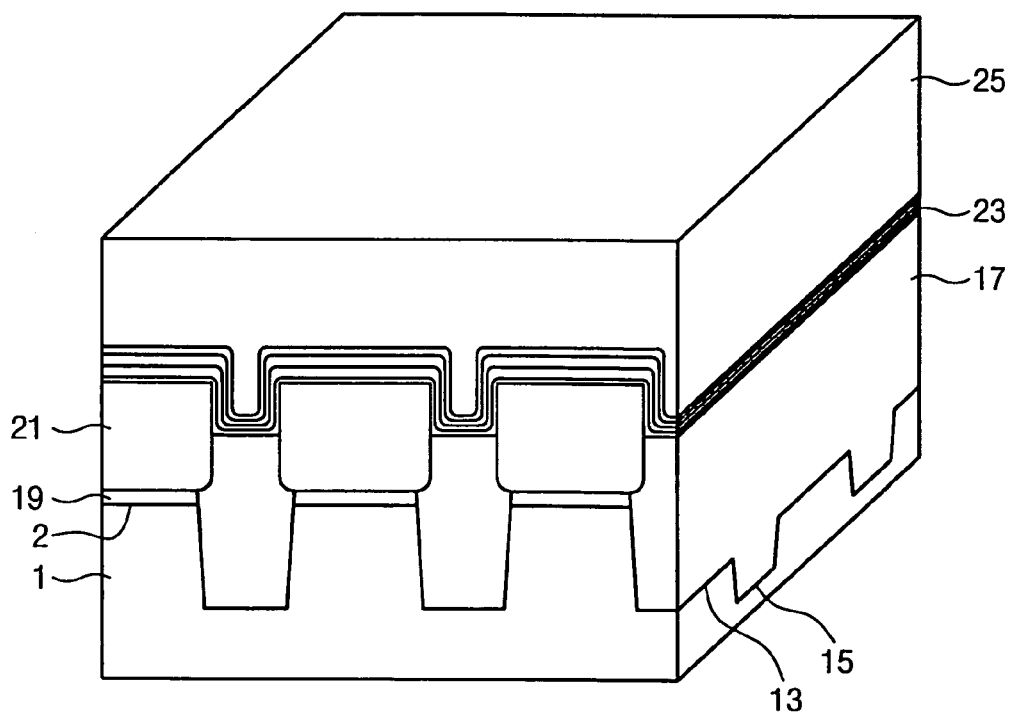

After completing the planarization, referring to FIG. 10, the exposed upper portion of the device isolation layer 17 may be partially recessed. This recession may be done to level the height of the device isolation layer 17 to a level lower than that of the upper surface of the floating gate patterns. Such a recession may extend an overlapping area between the floating gates and control gates. This overlapping area between the floating gates and control gates may enhance a coupling effect therethrough and also improve program efficiency. The recessing process may be accomplished by way of a dry or wet etching operation. After the recessing process, an intergate insulating layer 23 is deposited over the semiconductor substrate 1. The intergate insulating layer 23 may comprise of silicon oxide, silicon nitride, silicon oxynitride, hafnium oxide, tantalum oxide, and/or aluminum oxide. After the deposition of the intergate insulating layer 23, a control gate layer 25 is deposited on the intergate insulating layer 23. The control gate layer 25 may comprise of doped polysilicon, tungsten, tungsten silicide, and/or tungsten nitride.

Figure 11:
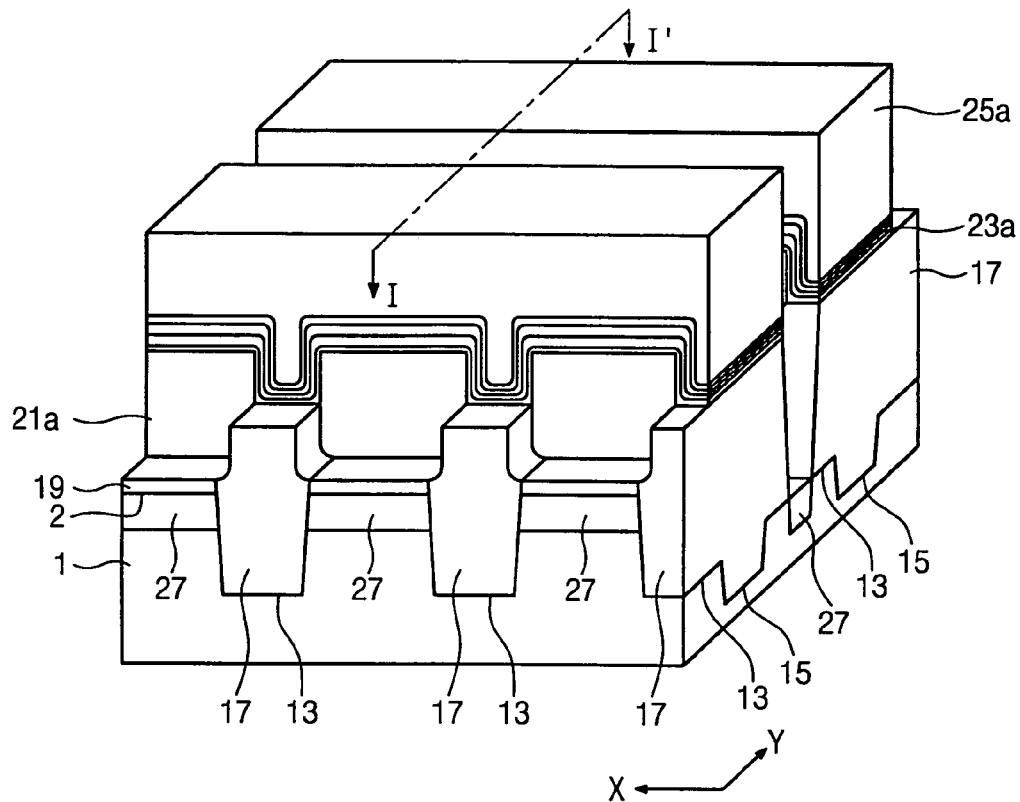
Figure 12:
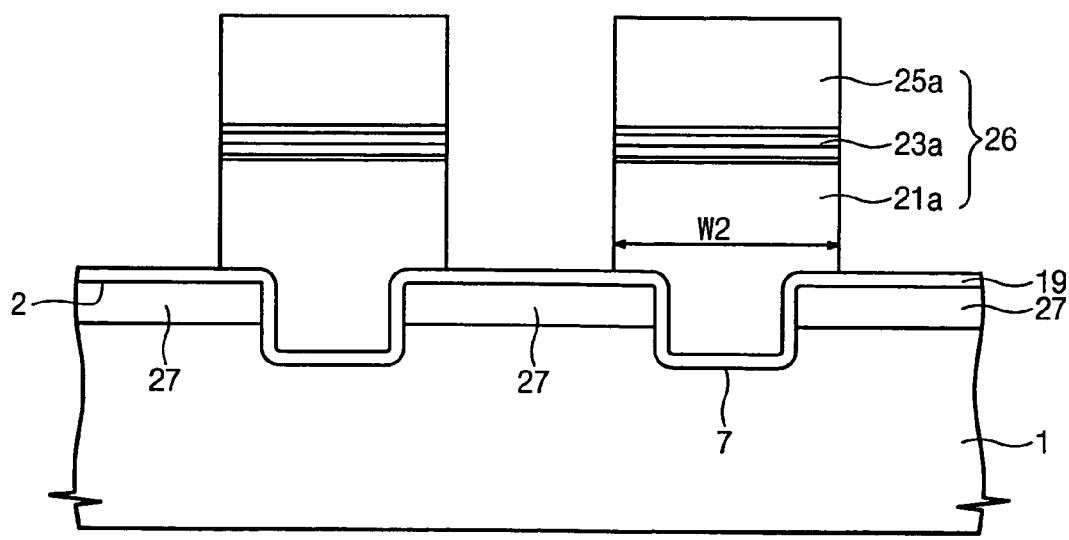
FIG. 12 is a sectional view taken along line I-I' of FIG. 11.

FIG. 12 illustrates a section taken along line I-I' of FIG. 11. Referring to FIGs. 11 and 12, the control gate layer 25, the intergate insulating layer 23, and the floating gate patterns are selectively etched by using an etch mask with a photoresist pattern (not shown) that overlaps with the recessed regions 7 and intersects the device isolation layer 17. This selective etching results in gate patterns 26 each of which comprises a word line WL (or a control gate 25a), an intergate insulating pattern 23a under the control gate 25a, and a floating gate 21a under the intergate insulating pattern 23a. Furthermore, the floating gates 21a fill the recessed regions 7. The width of the floating gate 21a is a second width W2. The second width W2 of the floating gate may be identical to or larger than the first width W1, that is the width of the recessed region 7. In addition, although not shown, capping patterns may be formed on the word lines 25a. Furthermore, spacers may be also provided to cover sidewalls of the word lines 25a.

Referring to FIG. 11, the semiconductor substrate 1 may be partially exposed by removing the device isolation layer 17 between adjacent word lines 25a by using a mask pattern (not shown) as an etch mask. Moreover, by using the word lines 25a as an ion implantation mask, impurity ions are injected (or implanted) into the semiconductor substrate 1 to form impurity regions 27.

Figure 13:
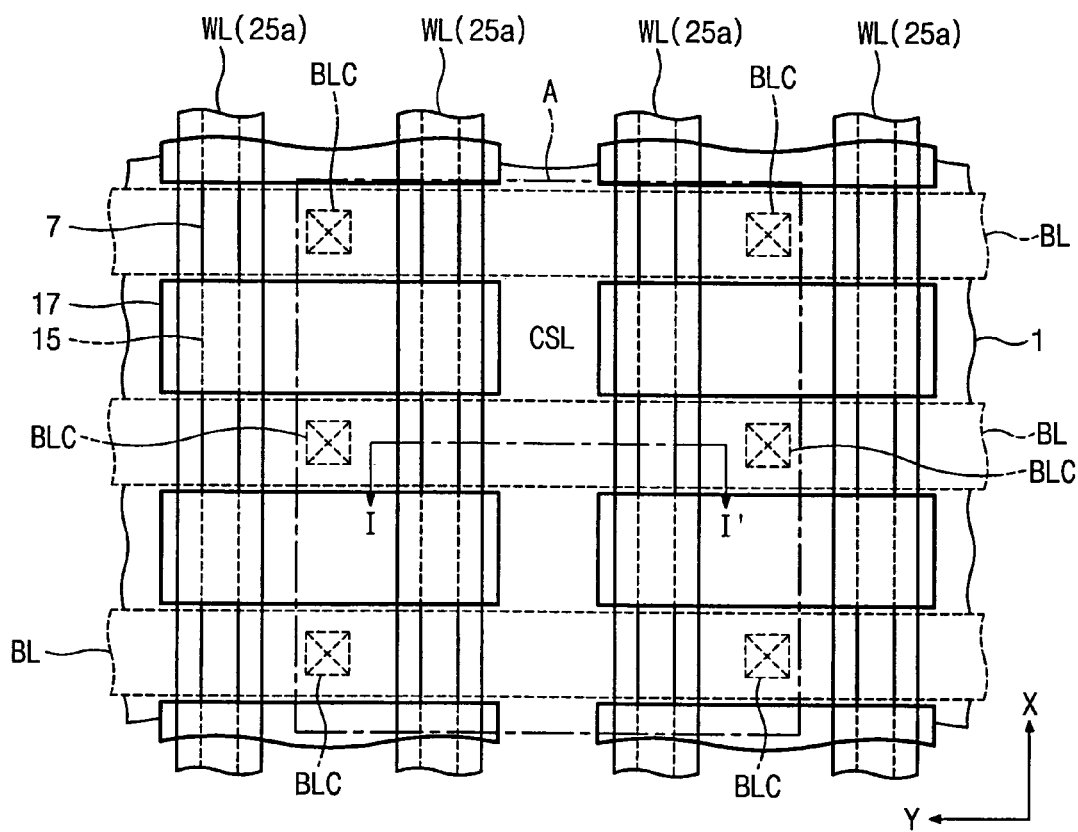
FIG. 13 is a plane view illustrating the NOR-type nonvolatile memory device in accordance with an exemplary disclosed embodiment of the invention.

The nonvolatile memory device shown in FIG. 11 or 12 may correspond to the NOR-type nonvolatile memory device whose plane view is shown in FIG. 13. That is, the nonvolatile memory device of FIG. 11 may be a perspective taken from portion A of FIG. 13, while FIG. 12 may be a section taken along line I-I' of FIG. 13. However, some features shown in one figure may not be shown in the others. For example, FIGS. 11 and 12 do not show bit line contact BLC and bit line BL that are shown in FIG. 13. In FIGS. 11 and 12, the impurity region 27 placed between the adjacent word lines 25a corresponds to a common source line CSL shown in FIG. 13.

The structure of a NOR-type nonvolatile memory device fabricated using the aforementioned processing method will now be described with reference to FIGS. 11 and 13. The plurality of device isolation layers 17 are arranged parallel to each other with confining active regions in the semiconductor substrate 1. In addition, the plurality of word lines (WL) 25a are arranged parallel to each other such that they cross over the active regions defined by the device isolation layer 17. One of the impurity regions 27, which is disposed in the active region between one word line and its adjacent word line, corresponds to a common drain region (not shown). Another one of the impurity regions 27, which is disposed in the active region between one word line and its adjacent word line, corresponds to the common source line CSL.

Furthermore, as shown in FIG. 13, the bit line contacts BLC are placed in the common drain regions. In addition, on the common drain regions, the plural bit lines BL are disposed parallel to each other to make contact with the bit line contacts BLC and to intersect the word lines (WL) 25a. The bottom profiles of the device isolation layer 17 are rugged by including shallower and deeper bottoms 13 and 15 along the bit lines BL under the word lines (WL) 25a. In an exemplary embodiment, the deeper bottoms 15 of the device isolation layer 17 are located around the recessed regions 7. Because the deeper bottoms 15 of the device isolation layer 17 accord depth to the recessed regions 7, they may prevent leakage current from flowing towards adjacent cells through the device isolation layer 17 during an operation of the NOR-type nonvolatile memory device.

Thus, because the trenches for the device isolation layer are formed after completing the recessed regions for channels, a better margin of DOF may be provided than that provided by a conventional method of semiconductor device fabrication. Furthermore, the disclosed method may be used to form the recessed regions with more precision than the conventional methods. Further, because the floating gates are self-aligned with the device isolation layer, the disclose method may prevent the issues arising from misalignment of the floating gates. The amount of DOF margin provided and the lack of misalignment occurring in the disclosed method may increase the reliability of a NOR-type nonvolatile memory device.

Figure 14A:
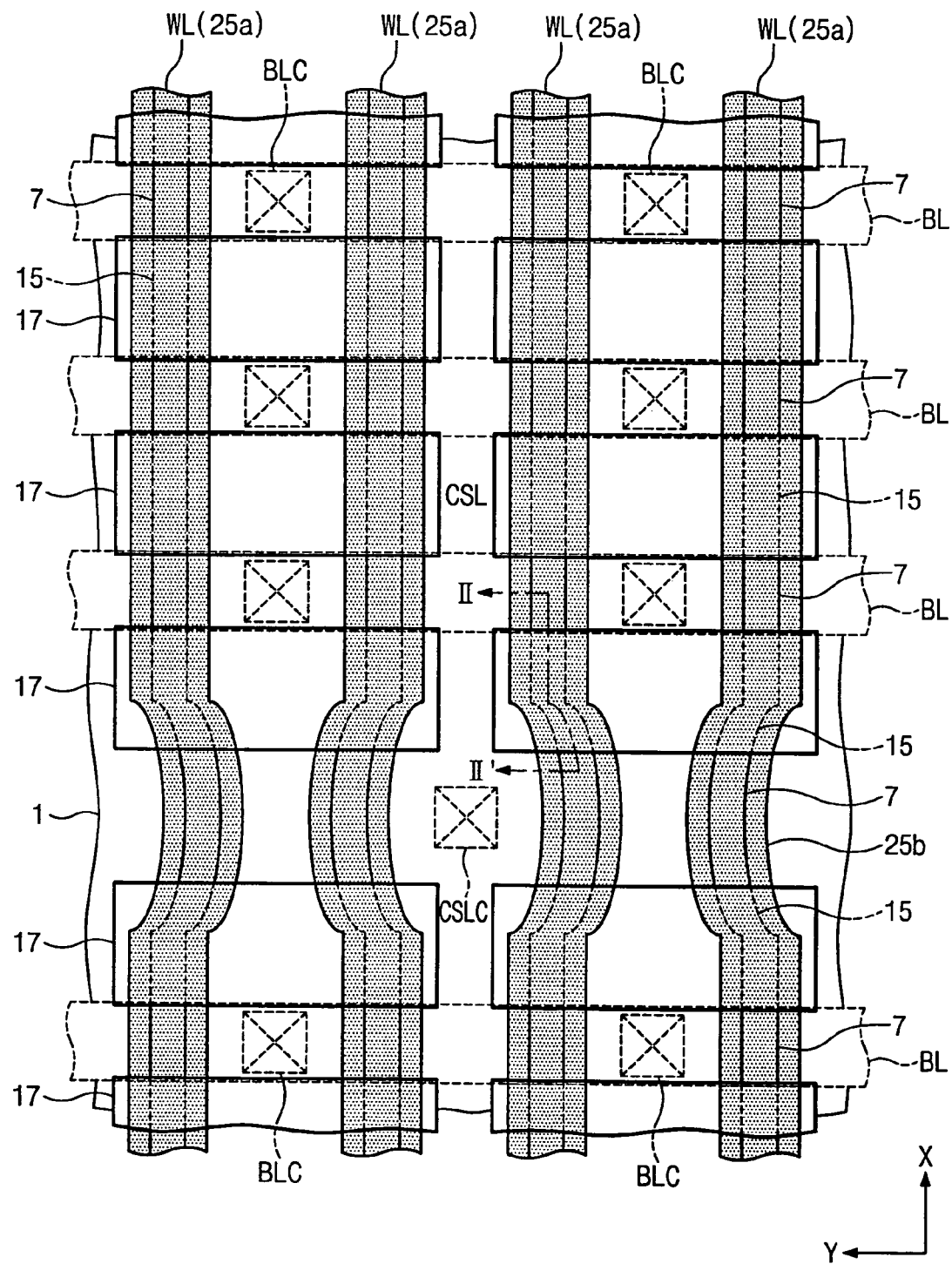
FIG. 14A is a plane view illustrating a NOR-type nonvolatile memory device in accordance with another exemplary disclosed embodiment of the invention.
Figure 14B:
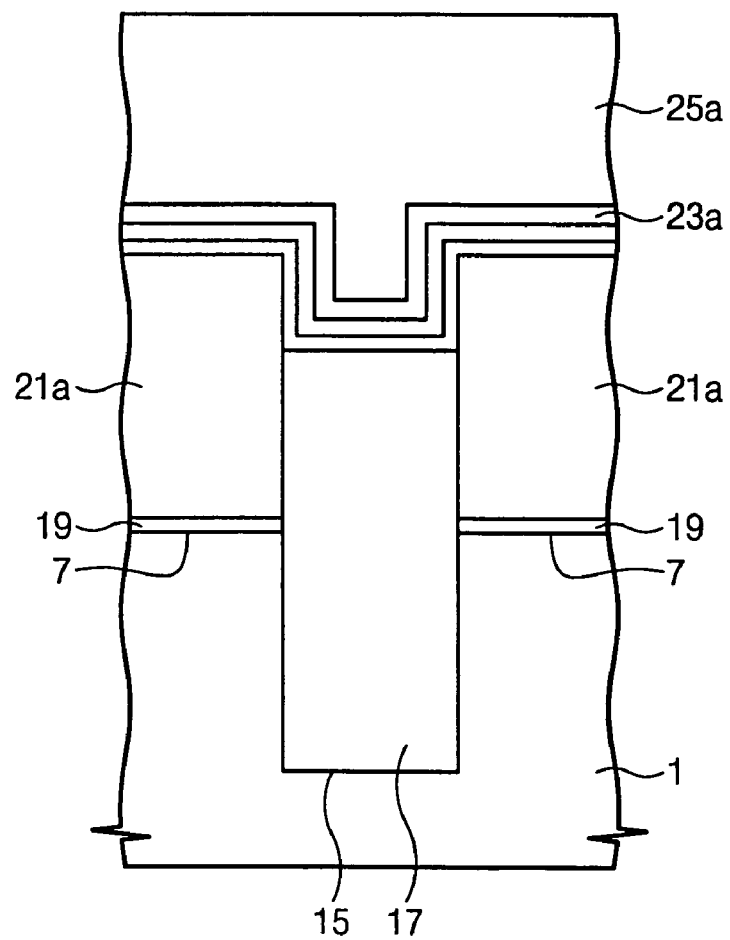
FIG. 14B is a sectional view taken along line II-II' of FIG. 14A.
Figure 15A:
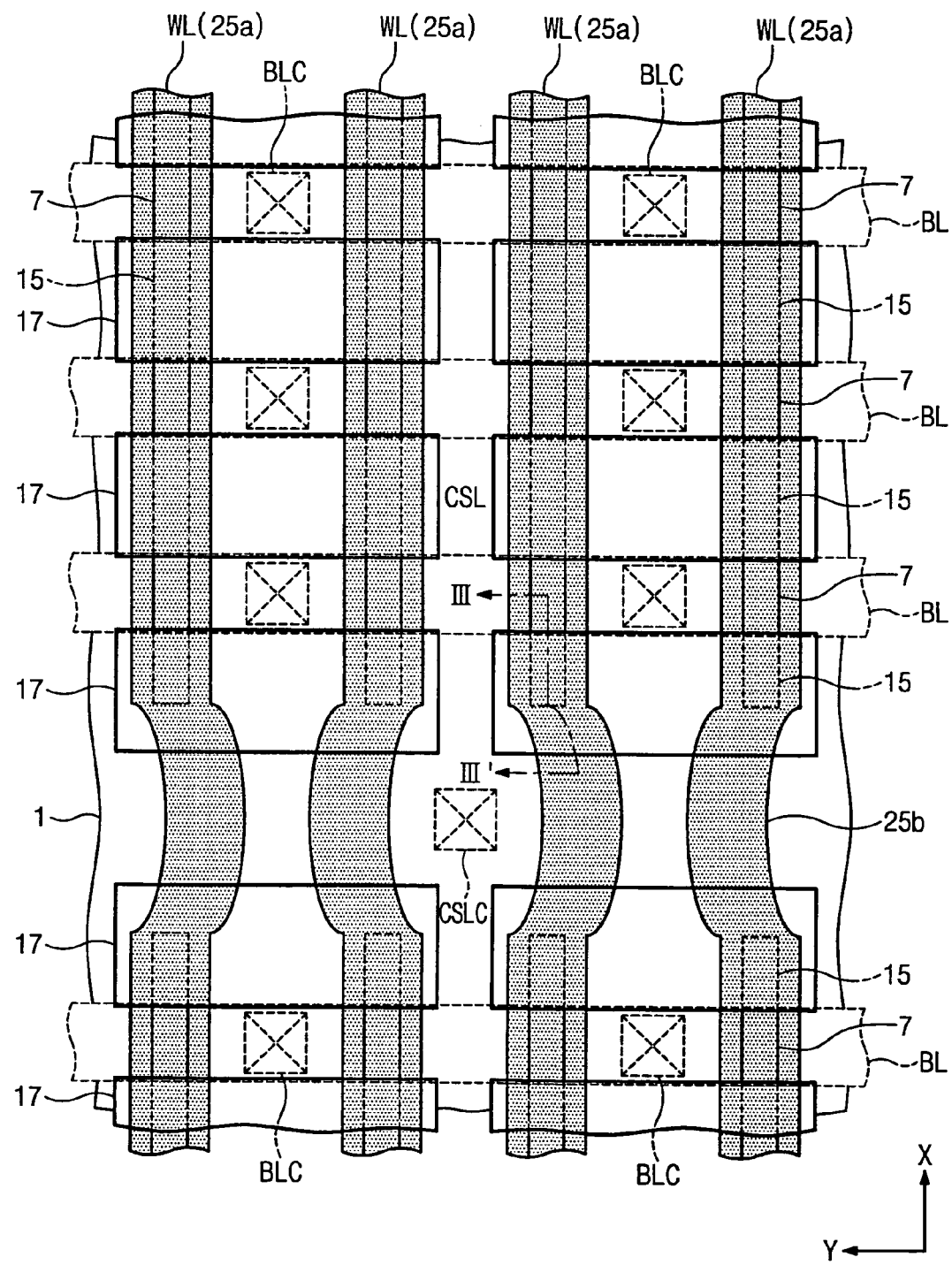
FIG. 15A is a plane view illustrating a NOR-type nonvolatile memory device in accordance with yet another exemplary disclosed embodiment of the invention.

On the other hand, the NOR-type nonvolatile memory device illustrated in FIGS. 11 through 13 may be modified as shown in FIGS. 14A and 15A. Specifically, FIG. 14A is a plane view illustrating a NOR-type nonvolatile memory device in accordance with another exemplary disclosed embodiment. Furthermore, FIG. 14B is a sectional view taken along line II-II' of FIG. 14A. Similarly, FIG. 15A is a plane view illustrating a NOR-type nonvolatile memory device in accordance with yet another exemplary disclosed embodiment, and FIG. 15B is a sectional view taken along line III-III' of FIG. 15A.

Referring to FIGS. 14A and 14B, a common source line contact CSLC for applying a voltage to the common source line CSL is disposed on the common source line CSL. Furthermore, the word lines WL are concaved toward the common source line contact CSLC around the common source line contact CSLC. In other words, the word lines WL are adjacent to the common source line contact CSLC and equipped with word line sidewalls 25b concaved toward the common source line contact CSLC. This structural feature may assure a proper processing margin by extending intervals among the word lines WL when forming the common source line contact CSLC. Furthermore, in the NOR-type nonvolatile memory device shown in FIGS. 14A and 14B, the recessed regions 7 are also placed under the word lines WL adjacent to the common source line contact CSLC. Moreover, the recessed regions 7 under the word lines WL adjacent to the common source line contact CSLC are also configured with sidewalls concaved toward the common source line contact CSLC along the concaved sidewalls 25b. Additionally, the deeper bottoms 15 are present even under the device isolation layer 17 adjacent to the common source line contact CSLC. To this end, some portions of sidewalls of the deeper bottoms 15 are bended along the profiles. Thereby, the sidewalls of the deeper bottoms 15 link with the sidewalls of the recessed regions 7, as shown in the plane of FIG. 14A. Other structural features of the device illustrated in FIGS. 14A and 14B are the same as those of the NOR-type nonvolatile memory device illustrated with reference to FIGS. 11 through 13.

A procedure for fabricating the NOR-type memory device with the structure shown in FIGS. 14A and 14B is similar to that aforementioned with reference to FIGS. 1 through 11, except for a few differences. For example, the recessed regions 7 are formed with sidewall profiles connected to the deeper bottoms 15 as shown in FIG. 14A. Moreover, in order to complete the profiles of the recessed regions 7 as shown in FIG. 14A, the hard mask patterns 5 need to have profiles corresponding to the recessed regions 7. While the hard mask patterns may be formed using any manufacturing process, the hard mask patterns 5 are beneficially formed by the chemical attachment process.

Figure 15B:
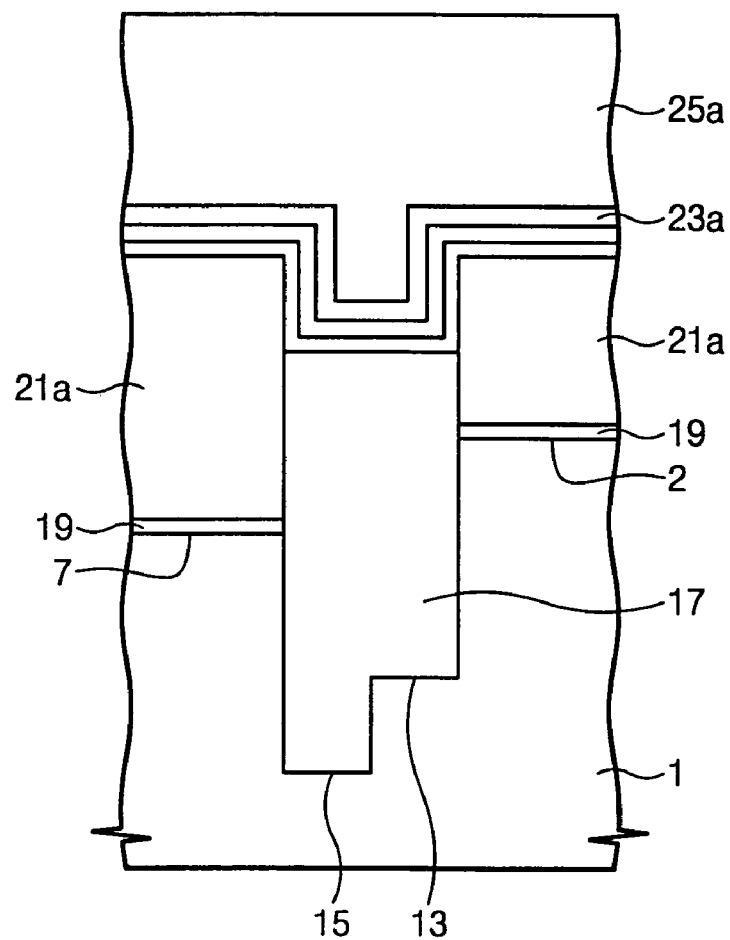
FIG. 15B is a sectional view taken along line III-III' of FIG. 15A.

On the other hand, referring to FIGS. 15A and 15B, while the word lines WL are concaved toward the common source line contact CSLC at the area adjacent to the common source line contact CSLC as like FIG. 14A, there may be no recessed region in the active regions under the word lines WL. In addition, the device isolation layer 17 adjacent to the common source line contact CSLC does not include the deeper bottoms 15 having bended sidewalls as shown in FIG. 14A. In contrast, in the NOR-type nonvolatile memory device shown in FIG. 15A, the deeper bottoms 15 link with the recessed regions 7 in a line and are located only under linear portions of the word lines WL. Thus, as illustrated in FIG. 15B, the device isolation layer 17 adjacent to the common source line contact CSLC is configured in rugged bottom profiles having the shallower and deeper bottoms 13 and 15, respectively.

A procedure for fabricating the NOR-type memory device with the structure shown in FIGS. 15A and 15B is similar to that aforementioned with reference to FIGS. 1 through 11, except for a few differences. For example, the recessed regions 7 are formed with sidewall profiles with lines connected to the deeper bottoms 15. In order to complete the linear profiles of the recessed regions 7 as shown in FIG. 14A, the hard mask patterns 5 (of FIG. 1) need to have profiles corresponding to the recessed regions 7. The hard mask patterns 5 are beneficially formed by using a photolithography process.

Yet another exemplary disclosed embodiment includes a modification for a NAND-type memory device. FIGS. 16A, 17A, 18A, 19A, 20A, 21A, and 22A are plane views illustrating sequential processing steps for fabricating an exemplary disclosed NAND-type nonvolatile memory device. In addition, FIGS. 16B, 17B, 18B, 19B, 20B, 21B, and 22B are sectional views taken along line IV-IV' of FIGS. 16A, 17A, 18A, 19A, 20A, 21A, and 22A, respectively. Moreover, FIGS. 16C, 17C, 18C, 19C, 20C, 21C, and 22C are sectional views taken along line V-V' of FIGS. 16A, 17A, 18A, 19A, 20A, 21A, and 22A, respectively.

Figure 16A:
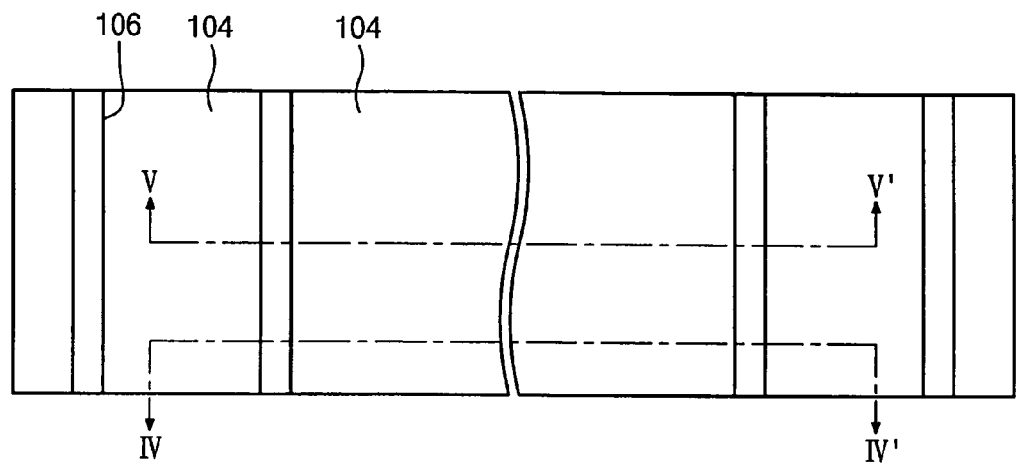
FIGS. 16A, 17A, 18A, 19A, 20A, 21A, and 22A are plane views illustrating sequential processing steps of fabricating a NAND-type nonvolatile memory device in accordance with another exemplary disclosed embodiment of the invention.
Figure 16B:
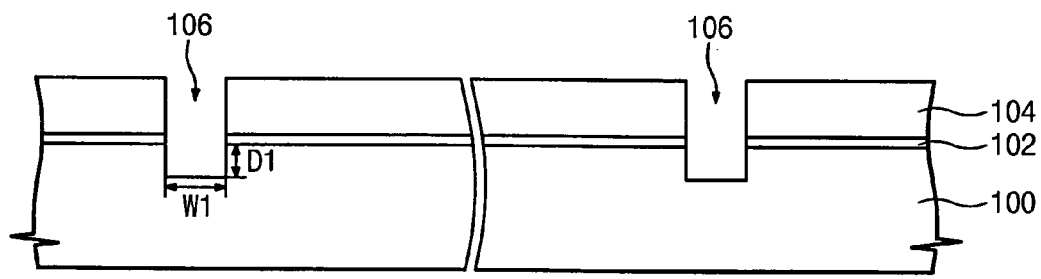
FIGS. 16B, 17B, 18B, 19B, 20B, 21B, and 22B are sectional views taken along line IV-IV' of FIGS. 16A, 17A, 18A, 19A, 20A, 21A, and 22A, respectively.
Figure 16C:
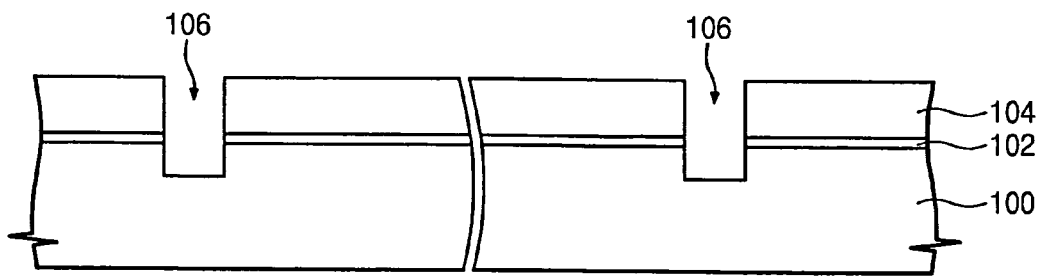
FIGS. 16C, 17C, 18C, 19C, 20C, 21C, and 22C are sectional views taken along line V-V' of FIGS. 16A, 17A, 18A, 19A, 20A, 21A, and 22A, respectively.

Referring to FIGS. 16A, 16B, and 16C, a pad oxide layer (not shown) is deposited entirely on a semiconductor substrate 100. In an exemplary embodiment, the semiconductor substrate 100 is illustrated as corresponding to a cell array region. After the deposition of the pad oxide layer, a first hard mask layer (not shown) is deposited on the pad oxide layer. The first hard mask layer may comprise silicon nitride or silicon oxynitride. Furthermore, a first photoresist pattern (not shown) including openings to confine a recessed channel region is arranged on the first hard mask layer. Additionally, using the first photoresist pattern for an etch mask, the first hard mask layer is selectively etched to form a first hard mask pattern 104. Using the first hard mask pattern 104 for an etch mask, the pad oxide layer is then selectively etched to form a pad oxide pattern 102. In addition, the semiconductor substrate 100 thereunder is etched to form recessed regions 106 in the first width W1 and a first depth D1. The recessed regions 106 are provided for recessed channels of ground and string selection lines. Specifically, the recessed regions 106 are arranged parallel to each other. Because the first photoresist pattern is formed on the first hard mask layer having a flat surface before forming the trenches, a sufficient margin for DOF is provided for in the disclosed semiconductor device. Therefore, it may be possible to precisely form the recessed regions 106 with the required depth and width.

Figure 17A:
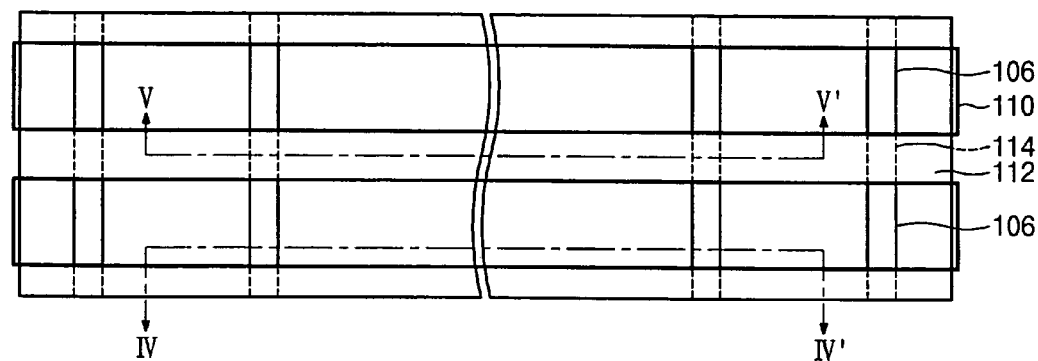
Figure 17B:
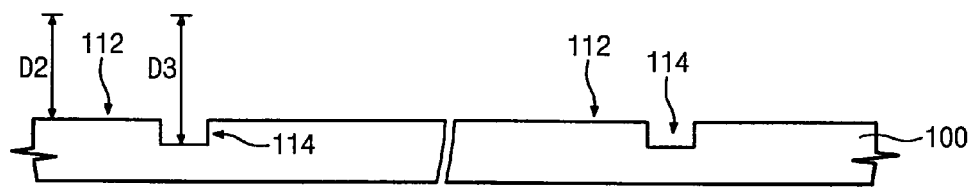
Figure 17C:
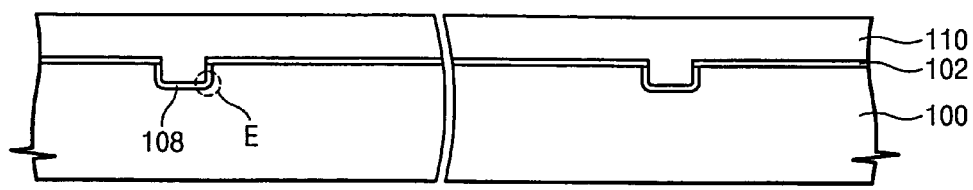

Referring to FIGS. 17A, 17B, and 17C, the semiconductor substrate 100 including the recessed regions 106 is oxidized to form passivation oxide layer 108 on the bottoms and sidewalls of the recessed regions 106. During the oxidation, the passivation oxide layer 108 is rounded as shown by the enclosed circle E, at corners where the bottoms of the recessed regions 106 meet with the sidewalls thereof. At this time, the first hard mask pattern 104 is removed. The removal of the first hard mask pattern 104 may be performed by using various chemicals such as, for example, phosphoric acid. During the removal of the first hard mask pattern 104, the passivation oxide layer 108 and the pad oxide patterns 102 may protect the semiconductor substrate 100 from being etched away. After removing the first hard mask pattern 104, second hard mask patterns 110 are formed to define a device isolation layer. The second hard mask patterns 110 are arranged parallel to each other in plurality such that they intersect the recessed regions 106 and expose the passivation oxide layers 108 and the pad oxide layers 102 at regions where the device isolation layer is provided in a subsequent processing step.

Using the second hard mask patterns 110 as an etch mask, the pad oxide patterns 102, the passivation oxide layers 108, and the semiconductor substrate 100 thereunder, are etched to form first trenches 112 in the second depth D2 and second trenches 114, which link with the first trenches, in the third depth D3. Specifically, the first trenches 112 are formed by grooving the semiconductor substrate 100 under the pad oxide patterns 102, while the second trenches 114 are formed by grooving the semiconductor substrate 100 under the recessed regions 106. Therefore, the third depth D3 corresponds to the sum of the first depth D1 in the recessed regions 106 and the second depth D2 in the first trenches 112.

Figure 18A:
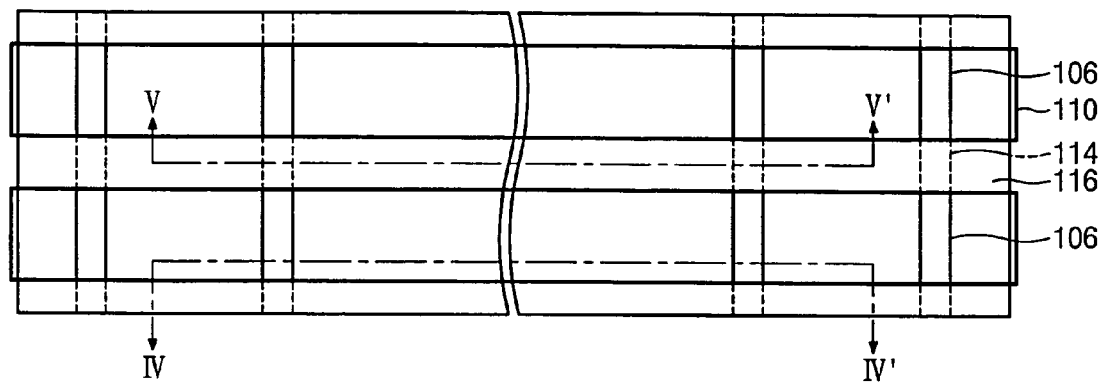
Figure 18B:
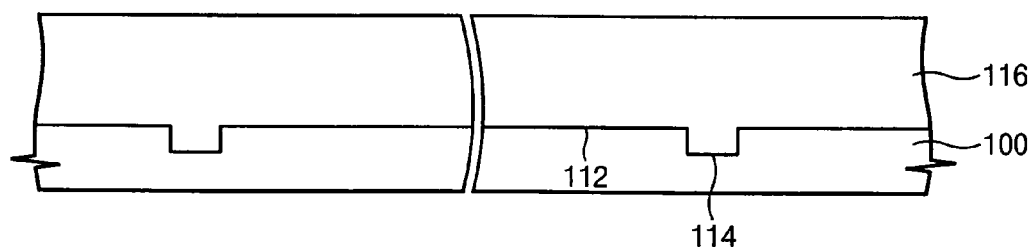
Figure 18C:
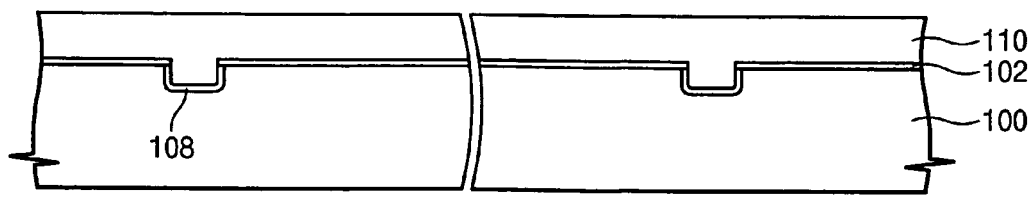

Next, referring to FIGS. 18A, 18B, and 18C, an insulating material for a device isolation layer is formed over the semiconductor substrate 100. This insulating material is deposited with a thickness larger than ½ of the width of the first trenches 112 and fills the first and second trenches 112 and 114. Furthermore, the insulating material may be formed in a single layer or a multi-level layer. The insulating material may include a number of materials. These materials may include, for example, thermal oxide, silicon nitride, silicon oxynitride, high-density plasma (HDP) oxide, or boron phosphorous silicate glass (BPSG).

Moreover, the insulating material is flattened (or planarized) to be leveled with the second hard mask patterns 110, to form the device isolation layer 116. In an exemplary embodiment, the device isolation layer 116 confines active regions in the cell array region. Furthermore, the device isolation layer 116 is formed such that it exposes the second hard mask patterns 110. Moreover, profiles on the bottoms of the device isolation layer 116 are rugged by the first and second trenches 112 and 114, respectively.

Figure 19A:
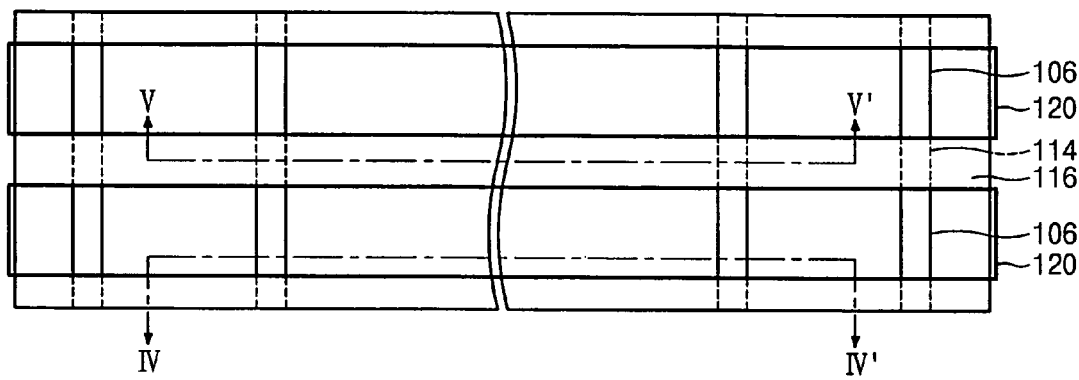
Figure 19B:
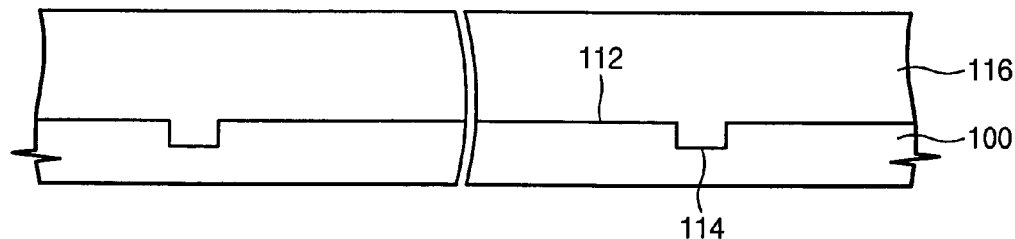
Figure 19C:
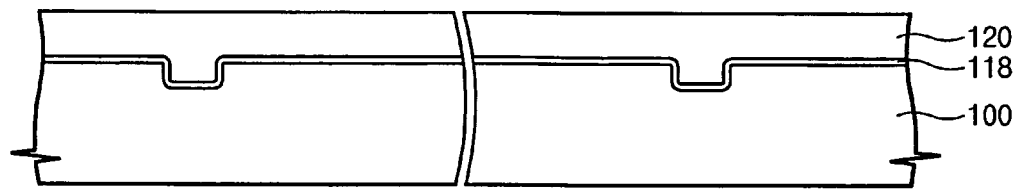

Referring to FIGS. 19A, 19B, and 19C, the second hard mask patterns 110 are removed. The removal of the second hard mask patterns 110 may be performed by using chemicals such as, for example, phosphoric acid. By removal of the second hard mask patterns 110, the upper sidewalls of the device isolation layer 116, the pad oxide patterns 102, and the passivation oxide layer 108 are exposed. In addition, the pad oxide patterns 102 and the passivation oxide layers 108 are also removed. The removal of the pad oxide patterns 102 and the passivation oxide layers 108 may be performed by chemicals such as, for example, fluoric acid. The removal of the pad oxide patterns 102 and the passivation oxide layers 108 exposes surfaces of the semiconductor substrate 100.

Thereafter, an oxidation process forms a gate insulation layer 118 on the exposed surfaces of the semiconductor substrate 100. Specifically, the gate insulation layer 118 is conformably formed along the profiles of the recessed regions 106. Because the corners of the recessed regions 106 are rounded, the gate insulation layer 118 is also rounded at the corners of the recessed regions 106. Next, a floating gate layer (not shown) is deposited over the semiconductor substrate 100, filling spaces between the device isolation layer 106. In addition, the floating gate layer is flattened to form floating gate patterns 120 by through a planarization process. This formation of floating gate patterns 120 exposes the upper surfaces of the device isolation layer 116.

Figure 20A:
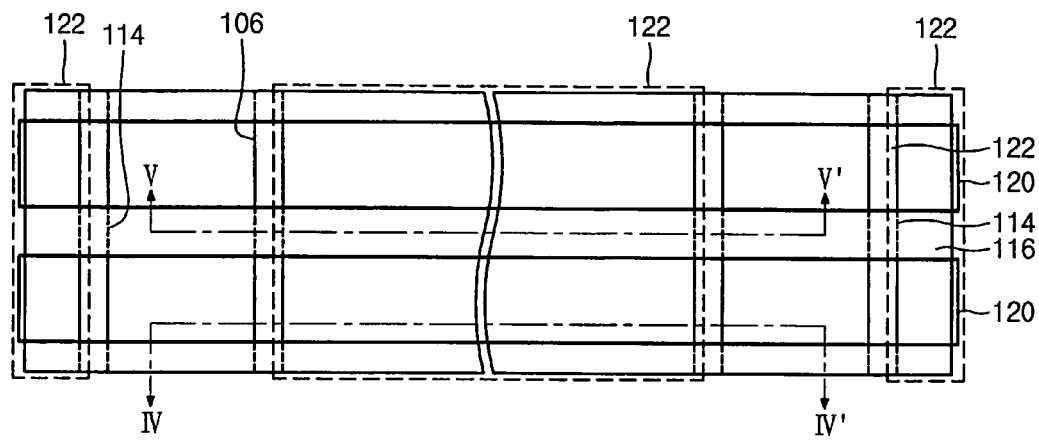
Figure 20B:
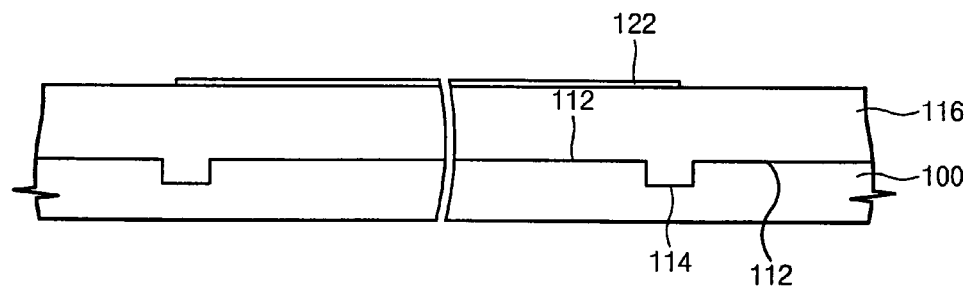
Figure 20C:
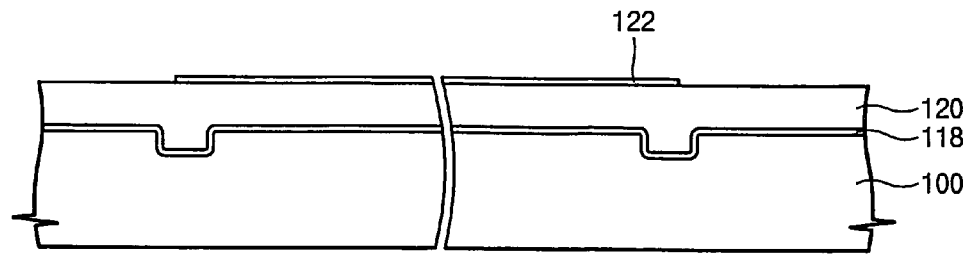

Thereafter, referring to FIGS. 20A, 20B, and 20C, the upper portion of the device isolation layer 116 is partially recessed. Furthermore, an intergate insulating layer 122 is deposited over the semiconductor substrate 100. Then, the intergate insulating layer 122 is selectively etched away to partially expose the floating gate patterns 120 and the device isolation layer 116. These exposed floating gate patterns 120 form floating gates of string and ground selection lines in the cell array of the NAND-type nonvolatile memory device.

Figure 21A:
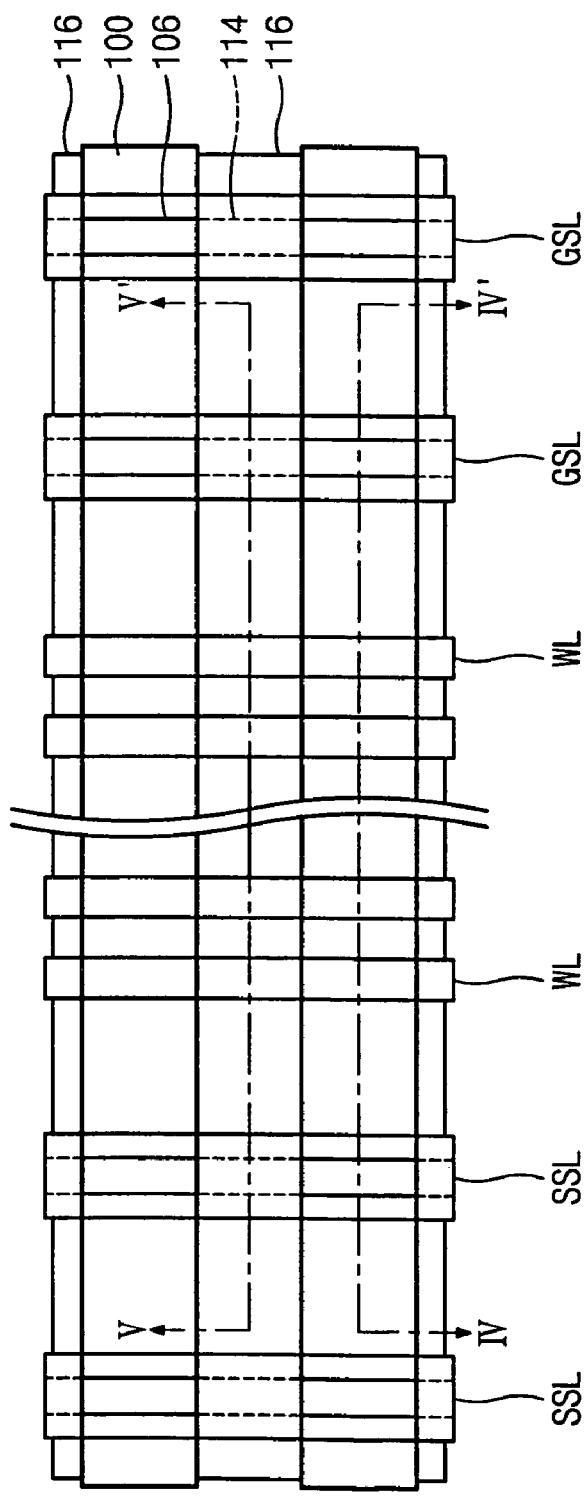
Figure 21B:
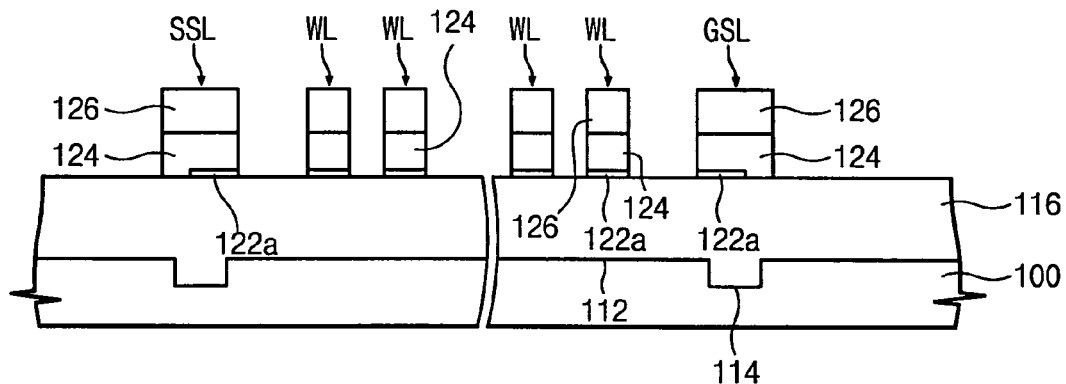
Figure 21C:
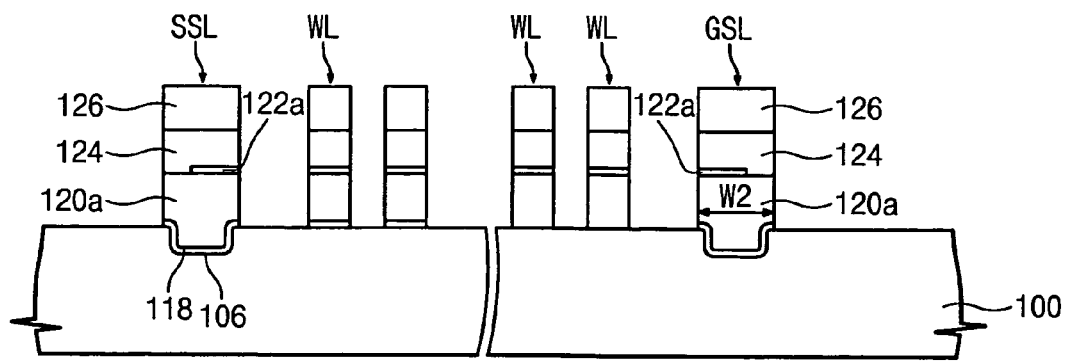

Next, referring to FIGS. 21A, 21B, and 21C, a control gate layer 124 and a capping layer 126 are stacked over the semiconductor substrate 100. Then, the capping and control gate layers, the intergate insulating layer 122 and the floating gate patterns 120 are etched to complete the ground and string selection lines GSL and SSL, respectively, and the word line WL. Each of the GSL, SSL, and WL includes a control gate 124, an intergate insulating pattern 122a under the control gate 124, and a floating gate 120a under the intergate insulating pattern 122a. Specifically, in the ground and string selection lines GSL and SSL, the intergate insulating pattern 122a is formed narrower in width than the width of the selection lines themselves. This narrow width of the intergate insulating pattern 122a makes the control gate 124 come in contact with the floating gate 120a. The contact between the control gate 124 and the floating gate 120a may prevent an increase of threshold voltage from a light programming of the selection lines. Furthermore, the floating gates 120a of the selection lines are formed to fill the recessed regions 106. In an exemplary embodiment, the width of the floating gate, i.e., the second width W2 may be equal to or larger than the width of the recessed region 106, i.e., the first width W1. Alternatively, the second width W2 may be smaller than the first width W1.

While the recessed regions 106 are not placed under the word lines (WL) 124 in an exemplary embodiment, it can be understood by those skilled in the art that they may also be formed under the word lines.

Figure 22A:
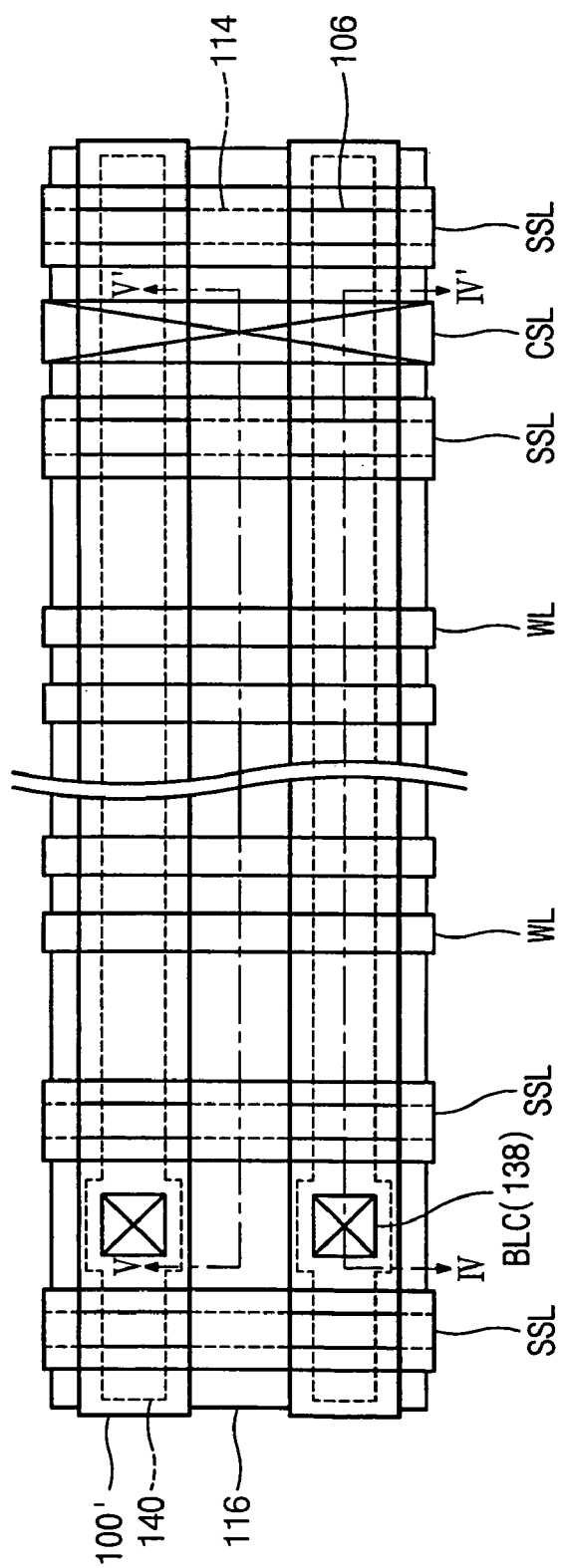
Figure 22B:
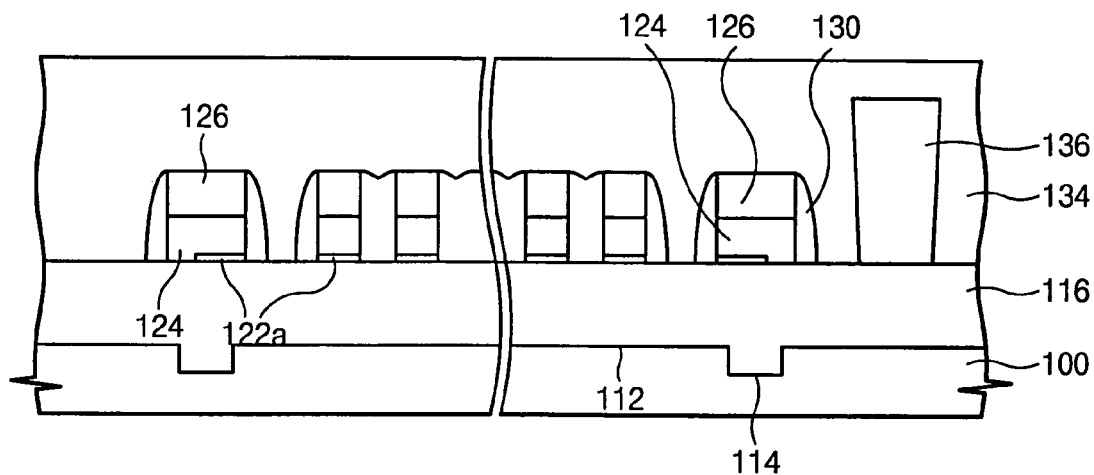
Figure 22C:
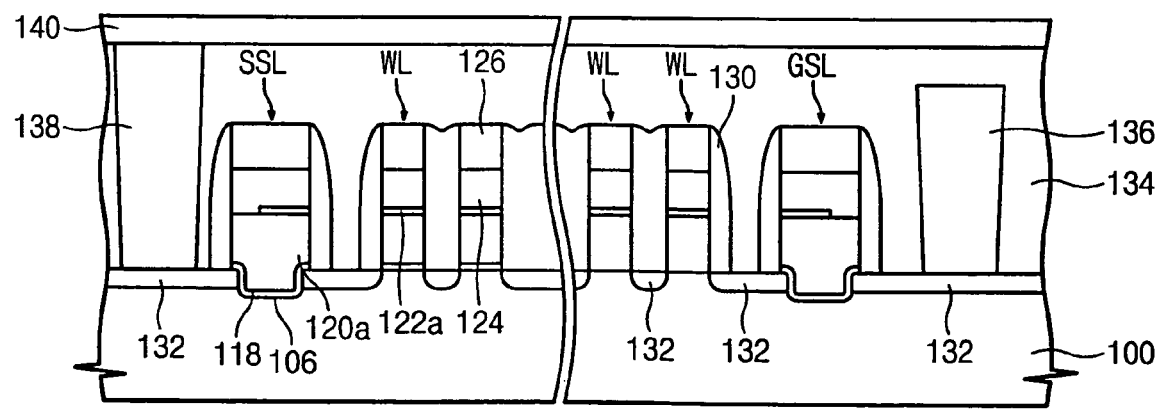

Referring to FIGS. 22A, 22B, and 22C, using the lines WL, SSL, and GSL as an ion implantation mask, impurity ions are injected into the active regions to form impurity regions 132. The impurity ions injected to form the impurity regions 132 vary according to locations in kind and concentration. Then, spacers 130 are formed on sidewalls of the lines WL, SSL, and GSL. Beneficially, the spacers 130 may be formed of at least a material selected from silicon nitride, silicon oxide, and silicon oxynitride. Furthermore, an interlevel insulation layer 134 is deposited over the semiconductor substrate 100. In addition, a common source line (CSL) 136 is formed on the semiconductor substrate 100. This CSL 136 is in contact with the impurity regions 132 through the interlevel insulation layer 134 between adjacent ground selection lines GSL. Moreover, bit line contacts (BLC) 138 are also formed on the semiconductor substrate 100. The BLC 138 is in contact with the impurity regions 132 through the interlevel insulation layer 134 between adjacent string selection lines SSL. In addition, bit lines (BL) 140 are formed on the interlevel insulation layer 134. In particular, the BL 140 are in contact with the bit line contacts 138 and also intersect the lines WL, SSL, and GSL.

As illustrated in FIGS. 22A, 22B, and 22C, in an exemplary disclosed NAND-type nonvolatile memory device fabricated according to the above-mentioned procedure, the plurality of device isolation layers 116 are disposed in parallel with each other. These plurality of device isolation layers 116 define the active regions in the semiconductor memory device 100. In addition, the string and ground selection lines SSL and GSL, respectively are arranged in parallel with each other such that intersect the active regions defined by the device isolation layers 116. Moreover, the plurality of world lines WL are also arranged parallel with each other and between the selection lines SSL and GSL.

Furthermore, as also illustrated in FIGS. 22A, 22B, and 22C, the disclosed device includes impurity regions 132. These impurity regions 132 are disposed between the adjacent ground selection lines GSL and are connected to each other through the common source line (CSL) 136. In addition, the bit line contacts (BLC) 138 are placed on the impurity regions 132 between the adjacent string selection lines SSL. These bit line contacts (BLC) 138 are in contact with the bit lines (BL) 140 that intersect the lines WL, SSL, and GSL. Here, the bottom profiles of the device isolation layers 116 are rugged along the bit lines BL under the selection lines SSL and GSL.

The disclosed NAN-type nonvolatile memory device may be used in any component that uses semiconductor flash memory. Because the trenches for the device isolation layer in the disclosed device are formed after completing the recessed regions for channels, it may make it easier to assure a sufficient margin of DOF. Furthermore, by forming the trenches after completing the recessed channels, it may be possible to form the recessed channels with more precision. In addition, because the floating gates are self-aligned with the device isolation layer, it may be possible to prevent or reduce misalignment between the floating gates and the device isolation layer. These features may help make the NAND-type nonvolatile memory device more reliable.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of fabricating a nonvolatile memory device, comprising:
   preparing a semiconductor substrate including a cell array region;
   forming a recessed region in the cell array region by etching the semiconductor substrate;
   etching at least a portion of the semiconductor substrate that partially includes the recessed region and forming first and second trenches that differ in depth, intersect the recessed region, and link with each other;
   forming a device isolation layer having rugged bottoms and defining an active region by filling an insulating material in the first and second trenches;
   forming a gate insulation layer on the semiconductor substrate of the active region including the recessed region; and
   forming a gate structure on the gate insulation layer, to fill the recessed region, the gate structure including a floating gate, an intergate insulating pattern, and a control gate.

2. The method as set forth in claim 1, wherein the first and second trenches are deeper than the recessed region and the second trench is deeper than the first trench.

3. The method as set forth in claim 2, wherein a depth of the second trench corresponds to a sum of depths of the recessed region and the first trench.

4. The method as set forth in claim 1, further comprising:
   forming a passivation oxide layer on a bottom and a sidewall in the recessed region by oxidizing the semiconductor substrate including the recessed region before forming the first and second trenches; and
   removing the passivation oxide layer before forming the gate insulation layer, to round a corner between the bottom and the sidewall in the recessed region.

5. The method as set forth in claim 1, wherein forming the gate structure on the gate insulation layer comprises:
   forming a floating gate layer all over the semiconductor substrate including the gate insulation layer;
   exposing an upper surface of the device isolation layer and forming a floating gate pattern adjacent to the device isolation layer by flattening the floating gate layer;
   partially recessing the upper portion of the device isolation layer;
   forming an intergate insulating layer;
   forming a control gate layer; and
   forming the gate structure by patterning the control gate layer, the intergate insulating layer, and the floating gate pattern.

6. The method as set forth in claim 5, further comprising:
   partially exposing the floating gate pattern by partially etching the intergate insulating layer before forming the control gate layer,
   wherein the intergate insulating pattern is smaller than the control gate in width and the floating gate is in contact with the control gate.

7. A method of fabricating a non-volatile memory device, comprising:
   preparing a semiconductor substrate including a cell array region;
   forming a pad oxide layer and a first hard mask layer on the semiconductor substrate;
   forming first hard mask patterns and pad oxide patterns by patterning the first hard mask layer and the pad oxide layer in the cell array region, the first hard mask patterns being formed in parallel with each other and crossing over the semiconductor substrate, and the pad oxide patterns being formed under the first hard mask patterns;
   forming pluralities of recessed regions in the semiconductor substrate by patterning the semiconductor substrate by using the first hard mask patterns as an etch mask;
   exposing the pad oxide patterns by removing the first hard mask patterns;
   forming pluralities of second hard mask patterns such that the pluralities of second hard mask patterns are parallel with each other and intersect the recessed regions on the semiconductor substrate where the pad oxide patterns are exposed;
   etching the pad oxide patterns and the semiconductor substrate to form a first trench, and etching the semiconductor substrate at the bottoms of the recessed regions to form a second trench deeper than the first trench, by using the second hard mask patterns as an etch mask;
   forming a device isolation layer having rugged bottoms and defining an action region by filling an insulating material in the first and second trenches;
   exposing the semiconductor substrate including the recessed regions adjacent to the device isolation layer by removing the second hard mask patterns and the pad oxide patterns;
   forming a gate insulation layer on the exposed semiconductor substrate; and
   forming gate structures on the gate insulation layer to fill the recessed regions, each of the gate structures including a floating gate, an interlevel gate insulation pattern, and a control gate.

8. The method as set forth in claim 7, wherein a depth of the second trench corresponds to a sum of depths of the recessed region and the first trench.

9. The method as set forth in claim 7, which further comprises:
   forming a passivation oxide layer on a bottom and a sidewall in the recessed region by oxidizing the semiconductor substrate after forming the recessed regions,
   removing the passivation oxide layer to round corners between the bottom and the sidewall in the recessed regions.

10. The method as set forth in claim 7, wherein forming the gate structure on the gate insulation layer comprises:
    forming a floating gate layer all over the semiconductor substrate including the gate insulation layer;
    exposing an upper portion of the device isolation layer and forming a floating gate pattern adjacent to the device isolation layer by flattening the floating gate layer;
    partially recessing the upper portion of the device isolation layer;
    forming an intergate insulating layer;
    forming a control gate layer; and
    etching the control gate layer, the intergate insulating layer, and the floating gate pattern to form the gate structure that includes the control gate intersecting the device isolation layer, an intergate insulating pattern under the control gate, and the floating gate that is disposed under the intergate insulating pattern and adjacent to the device isolation layer.

11. The method as set forth in claim 10, further comprising:
    partially exposing the floating gate pattern by etching the intergate insulating layer before forming the control gate layer,
    wherein the intergate insulating pattern is smaller than the control gate in width and the floating gate is in contact with the control gate.

* * * * *